(12) United States Patent
Sasaki

(10) Patent No.: US 9,825,060 B2
(45) Date of Patent: Nov. 21, 2017

(54) SEMICONDUCTOR DEVICE

(71) Applicant: Japan Display Inc., Tokyo (JP)

(72) Inventor: Toshinari Sasaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/388,126

(22) Filed: Dec. 22, 2016

(65) Prior Publication Data

US 2017/0104014 A1 Apr. 13, 2017

Related U.S. Application Data

(63) Continuation of application No. 14/927,534, filed on Oct. 30, 2015, now Pat. No. 9,564,538.

(30) Foreign Application Priority Data

Oct. 30, 2014 (JP) .................................. 2014-221289

(51) Int. Cl.
| | |
|---|---|
| H01L 29/10 | (2006.01) |
| H01L 27/12 | (2006.01) |
| H01L 29/786 | (2006.01) |
| H01L 29/417 | (2006.01) |
| H01L 29/423 | (2006.01) |

(52) U.S. Cl.
CPC .... *H01L 27/1225* (2013.01); *H01L 29/41733* (2013.01); *H01L 29/42384* (2013.01); *H01L 29/7869* (2013.01); *H01L 29/78642* (2013.01); *H01L 29/78696* (2013.01); *H01L 2029/42388* (2013.01)

(58) Field of Classification Search
CPC ........................ H01L 27/1225; H01L 29/7869
USPC .......................................................... 257/43
See application file for complete search history.

(56) References Cited

U.S. PATENT DOCUMENTS

| | | | |
|---|---|---|---|
| 8,916,865 | B2 | 12/2014 | Yamazaki |
| 2010/0102314 | A1 | 4/2010 | Miyairi et al. |
| 2013/0285050 | A1 | 10/2013 | Yamazaki et al. |
| 2015/0221679 | A1 | 8/2015 | Yamazaki et al. |
| 2015/0303217 | A1 | 10/2015 | Tanaka et al. |
| 2016/0005873 | A1 | 1/2016 | Jintyou et al. |

FOREIGN PATENT DOCUMENTS

JP   2010-062229 A   3/2010

*Primary Examiner* — Anthony Ho
(74) *Attorney, Agent, or Firm* — Typha IP LLC

(57) ABSTRACT

A semiconductor device includes a first insulating layer having a first side wall, an oxide semiconductor layer located on the first side wall, a gate insulating layer located on the oxide semiconductor layer, the oxide semiconductor layer being located between the first side wall and the gate insulating layer, a gate electrode facing the oxide semiconductor layer located on the first side wall, the gate insulating layer being located between the oxide semiconductor layer and the gate electrode, a first electrode located below the oxide semiconductor layer and connected with one portion of the oxide semiconductor layer, and a second electrode located above the oxide semiconductor layer and connected with the other portion of the oxide semiconductor layer.

20 Claims, 32 Drawing Sheets

SEMICONDUCTOR DEVICE

CROSS-REFERENCE TO RELATED APPLICATIONS

This application is a continuation of U.S. patent application Ser. No. 14/927,534, filed on Oct. 30, 2015. Further, this application is based upon and claims the benefit of priority from the prior Japanese Patent Application No. 2014-221289, filed on Oct. 30, 2014, the entire contents of which are incorporated herein by reference.

FIELD

The present invention relates to a semiconductor device, and an embodiment disclosed herein relates to a structure and a layout of a semiconductor device.

BACKGROUND

Recently, a driving circuit of a display device, a personal computer or the like includes a semiconductor device such as a transistor, a diode or the like as a microscopic switching element. Especially in a display device, a semiconductor device is used as a selective transistor that supplies a voltage or a current in accordance with the gray scale of each of pixels and also used in a driving circuit that selects a pixel that supplies the voltage or the current. The characteristics required of a semiconductor vary in accordance with the use thereof. For example, a semiconductor used as a selective transistor is required to have a low off-current or little variance from another selective semiconductor. A semiconductor used in a driving circuit is required to have a high on-current.

To be used in a display device as described above, a semiconductor device including a channel formed of amorphous silicon, low-temperature polysilicon or single crystalline silicon has been conventionally developed. A semiconductor device including a channel formed of amorphous silicon can be formed with a simpler structure and in a low-temperature process of 400° C. or lower, and therefore can be formed by use of a large glass substrate referred to as an eighth-generation glass substrate (2160×2460 mm). However, such a semiconductor device including a channel formed of amorphous silicon has a low mobility and is not usable in a driving circuit.

A semiconductor device including a channel formed of low-temperature polysilicon or single crystalline silicon has a higher mobility than the semiconductor device including a channel formed of amorphous silicon, and therefore is usable as a selective transistor and also in a driving circuit. However, such a semiconductor device including a channel formed of low-temperature polysilicon or single crystalline silicon has a complicated structure and needs a complicated process to be manufactured. In addition, such a semiconductor device needs to be formed in a high temperature process of 500° C. or higher, and therefore cannot be formed by use of a large glass substrate as described above. A semiconductor device including a channel formed of amorphous silicon, low-temperature polysilicon or single crystalline silicon has a high off-current. In the case where such a semiconductor device is used as a selective transistor, it is difficult to keep the applied voltage for a long time.

For the above-described reasons, a semiconductor device including a channel formed of an oxide semiconductor, instead of amorphous silicon, low-temperature polysilicon or single crystalline silicon, has been progressively developed recently (e.g., Japanese Laid-Open Patent Publication No. 2010-062229). It is known that a semiconductor device including a channel formed of an oxide semiconductor can be formed with a simple structure and in a low-temperature process like a semiconductor device including a channel formed of amorphous silicon, and has a mobility higher than that of a semiconductor device including a channel formed of amorphous silicon. It is also known that such a semiconductor device including a channel formed of an oxide semiconductor has a very low off-current.

However, the mobility of the semiconductor device including a channel formed of an oxide semiconductor is lower than that of the semiconductor device including a channel formed of low-temperature polysilicon or single crystalline silicon. Therefore, in order to provide a higher on-current, the semiconductor device including a channel formed of an oxide semiconductor needs to have a shorter channel length (L length). In order to shorten the channel length of the semiconductor device described in Japanese Laid-Open Patent Publication No. 2010-062229, a distance between a source and a drain needs to be shortened.

The distance between a source and a drain is determined by a photolithography step and an etching step. In the case where patterning is performed by photolithography, size reduction is restricted by the size of a mask pattern of an exposure device. Especially in the case where patterning is performed on a glass substrate by photolithography, the minimum size of a mask pattern is about 2 μm, and the reduction in the channel length of the semiconductor device is restricted by such a size of the mask pattern. The channel length of the semiconductor device is restricted by photolithography, and therefore, is influenced by the in-plane variance of the substrate in the photolithography step.

SUMMARY

A semiconductor device in an embodiment according to the present invention includes a first insulating layer having a first side wall, an oxide semiconductor layer located on the first side wall, a gate insulating layer located on the oxide semiconductor layer, the oxide semiconductor layer being located between the first side wall and the gate insulating layer, a gate electrode facing the oxide semiconductor layer located on the first side wall, the gate insulating layer being located between the oxide semiconductor layer and the gate electrode, a first electrode located below the oxide semiconductor layer and connected with a first portion of the oxide semiconductor layer, and a second electrode located above the oxide semiconductor layer and connected with a second portion of the oxide semiconductor layer.

A semiconductor device in an embodiment according to the present invention includes a first insulating layer having a first side wall having a tapered inclining surface tending to close upward, an oxide semiconductor layer located on the first side wall, a gate insulating layer located on the oxide semiconductor layer, a gate electrode located on the gate insulating layer, a first electrode located below the oxide semiconductor layer and connected with a first portion of the oxide semiconductor layer, and a second electrode located above the oxide semiconductor layer and connected with a second portion of the oxide semiconductor layer.

A semiconductor device in an embodiment according to the present invention includes a first insulating layer having a first side wall, a first electrode located above the first insulating layer, an oxide semiconductor layer located on the first side wall and the first electrode, a first portion of the oxide semiconductor layer being connected with the first electrode, a gate insulating layer located on the oxide semiconductor layer, the oxide semiconductor layer being located between the first side wall and the gate insulating layer, a gate electrode facing the oxide semiconductor layer located on the first side wall, the gate insulating layer being located between the oxide semiconductor layer and the gate electrode, a second electrode located below the oxide semiconductor layer and connected with a second portion of the oxide semiconductor layer, and a third electrode located above the first electrode and connected with the first electrode.

A semiconductor device in an embodiment according to the present invention includes a first insulating layer having a first side wall having a tapered inclining surface tending to close upward, a first electrode located above the first insulating layer, an oxide semiconductor layer located on the first side wall and the first electrode, a first portion of the oxide semiconductor layer being connected with the first electrode, a gate insulating layer located on the oxide semiconductor layer, a gate electrode located on the gate insulating layer, a second electrode located below the oxide semiconductor layer and connected with a second portion of the oxide semiconductor layer, and a third electrode located above the first electrode and connected with the first electrode.

DESCRIPTION OF EMBODIMENTS

Figure 1:
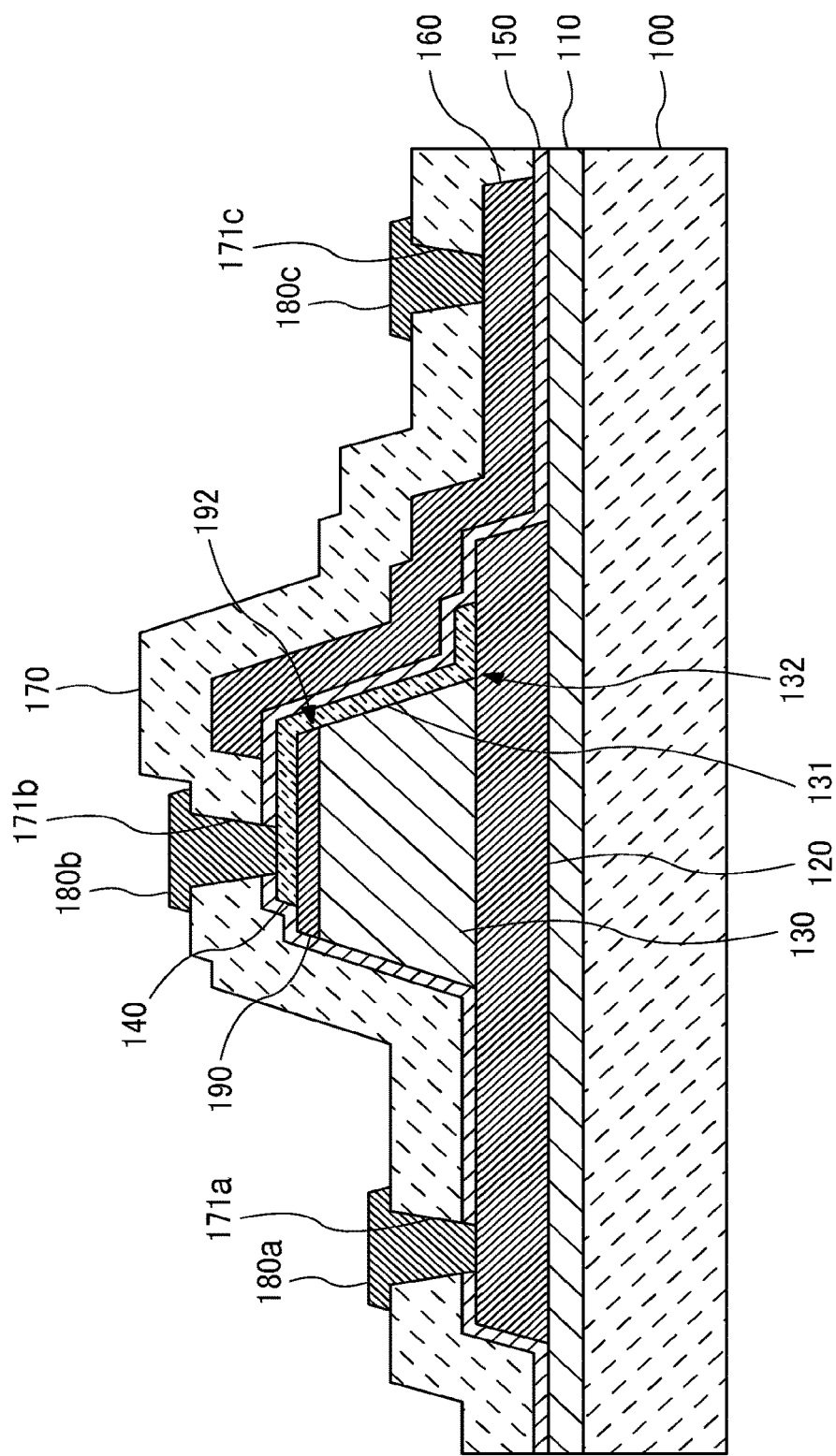
FIG. 1 is a cross-sectional view showing an overview of a semiconductor device in an embodiment according to the present invention.

Hereinafter, embodiments of the present invention will be described with reference to the drawings. The disclosure is merely exemplary, and alternations and modifications easily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted. The following embodiments are presented for the purpose of providing a semiconductor device capable of increasing the on-current or providing a semiconductor device capable of suppressing the in-plane variance of the channel length.

Embodiment 1

With reference to FIG. 1, an overview of a semiconductor device 10 in embodiment 1 according to the present invention will be described. The semiconductor device 10 in embodiment 1 is usable in a pixel or a driving circuit of a liquid crystal display device (LCD), a spontaneous light-emitting device using an organic light-emitting diode (OLED) such as an organic EL element, a quantum dot or the like for a display unit, or a reflection-type display device such as an electronic paper or the like.

It should be noted that a semiconductor device according to the present invention is not limited to being used in a display device, and may be used in, for example, an integrated circuit (IC) such as a microprocessing unit (MPU) or the like. The semiconductor device 10 in embodiment 1 is described as having a structure including a channel formed of an oxide semiconductor. The semiconductor device 10 in embodiment 1 is not limited to having such a structure, and may include a channel formed of, for example, a semiconductor such as silicon or the like, a compound semiconductor such as Ga—As or the like, or an organic semiconductor such as pentacene, tetracyanoquinodimethane (TCNQ) or the like. In embodiment 1, the semiconductor device 10 is a transistor. This does not limit the semiconductor device according to the present invention to a transistor.
[Structure of the Semiconductor Device 10]

FIG. 1 is a cross-sectional view showing an overview of the semiconductor device 10 in embodiment 1 according to the present invention. As shown in FIG. 1, the semiconductor device 10 includes a substrate 100, an underlying layer 110 located on the substrate 100, a lower electrode 120 located on the underlying layer 110, a first insulating layer 130 located on the lower electrode 120 and having a first side wall 131, a first assisting electrode 190 located above the first insulating layer 130, and an oxide semiconductor layer 140 located on the first assisting electrode 190 and the first side wall 131 and connected with the lower electrode 120 located therebelow. The first assisting electrode 190 may be described as being held, at a position above the first insulating layer 130, between the first insulating layer 130 and the oxide semiconductor layer 140.

The semiconductor device 10 also includes a gate insulating layer 150 located opposite to the first insulating layer 130 while having the oxide semiconductor layer 140 therebetween, and a gate electrode 160 facing the oxide semiconductor layer 140 located at least on the first side wall 131, with the gate insulating layer 150 being located between the oxide semiconductor layer 140 and the gate electrode 160. The semiconductor device 10 further includes an interlayer insulating layer 170 located on the gate electrode 160, and upper electrodes 180 located in openings 171 formed in the interlayer insulating layer 170. The upper electrodes 180 specifically include upper electrodes 180a, 180b and 180c, but may be collectively referred to as the "upper electrodes 180" in the case where the upper electrodes 180a, 180b and 180c are not specifically distinguished from each other. The upper electrodes 180a, 180b and 180c are respectively connected with the lower electrode 120, the oxide semiconductor layer 140 and the gate electrode 160. The openings 171 specifically include openings 171a, 171b and 171c, but may be collectively referred to as the "openings 171" in the case where the openings 171a, 171b and 171c are not specifically distinguished from each other. A part of the upper electrodes 180 is located above the oxide semiconductor layer 140. The oxide semiconductor layer 140 includes a portion (first portion) thereof connected with the lower electrode 120 in a region 132 and another portion (second portion) thereof connected with the upper electrode 180b and the first assisting electrode 190 in a region 192. In the case where a source voltage is applied to the upper electrode 180a and a drain voltage is applied to the upper electrode 180b, the region 132 may be referred to as a "source region" and the region 192 may be referred to as a "drain region". The upper electrode 180b is connected with the oxide semiconductor layer 140 on a side opposite to the first assisting electrode 190.

The first side wall 131 may have a tapered inclining surface tending to close upward. Such a shape may be referred to as "forward tapered". In this case, the oxide semiconductor layer 140 may be described as being located on the first side wall 131. The gate insulating layer 150 may be described as being located on the oxide semiconductor layer 140. The gate electrode 160 may be described as being located on the gate insulating layer 150. In FIG. 1, the first assisting electrode 190 is located so as to cover a top surface of the first insulating layer 130. The first assisting electrode 190 does not need to be formed on the entirety of the top surface of the first insulating layer 130. It is sufficient that the first assisting electrode 190 is formed on at least a part of the top surface of the first insulating layer 130. The first assisting electrode 190 may be formed on a part of the first side wall 131 in addition to on the first insulating layer 130.

The substrate 100 may be formed of glass. Alternatively, the substrate 100 may be formed of a light-transmissive insulating material such as quartz, sapphire, a resin or the like. In the case where the semiconductor device 10 is used in an integrated circuit, not in a display device, the substrate 100 may be formed of a light-non-transmissive material, for example, a semiconductor such as silicon, silicon carbide, a compound semiconductor or the like, or a conductive material such as stainless steel or the like.

The underlying layer 110 may be formed of a material that suppresses diffusion of impurities from the substrate 100 into the oxide semiconductor layer 140. For example, the underlying layer 110 may be formed of silicon nitride (SiN$_x$), silicon nitride oxide (SiN$_x$O$_y$), silicon oxide (SiO$_x$), silicon oxide nitride (SiO$_x$N$_y$), aluminum nitride (AlN$_x$), aluminum nitride oxide (AlN$_x$O$_y$), aluminum oxide (AlO$_x$), aluminum oxide nitride (AlO$_x$N$_y$), or the like (x and y each represent an arbitrary value). Alternatively, the underlying layer 110 may have a structure including a stack of films of such materials.

SiO$_x$N$_y$ and AlO$_x$N$_y$ are respectively a silicon compound and an aluminum compound containing nitrogen (N) at a lower content than oxygen (O). SiN$_x$O$_y$ and AlN$_x$O$_y$ are respectively a silicon compound and an aluminum compound containing oxygen at a lower content than nitrogen.

The underlying layer 110 described above may be formed of a PVD (Physical Vapor Deposition) method or a CVD (Chemical Vapor Deposition) method. Examples of the usable PVD method include sputtering, vacuum vapor deposition, electron beam vapor deposition, plating, molecular beam epitaxy, and the like. Examples of the usable CVD method include thermal CVD, plasma CVD, catalyst CVD (catalytic-CVD or hot-wire CVD), and the like. A method other than the above-listed vapor deposition methods may be used as long as the film thickness can be controlled by a nanometer order (range less than 1 µm).

The lower electrode 120 may be formed of a common metal material or a common conductive semiconductor material. For example, the lower electrode 120 may be formed of aluminum (Al), titanium (Ti), chromium (Cr), cobalt (Co), nickel (Ni), zinc (Zn), molybdenum (Mo), indium (In), tin (Sn), hafnium (Hf), tantalum (Ta), tungsten (W), platinum (Pt), bismuth (Bi), or the like. Alternatively, the lower electrode 120 may be formed of an alloy of such materials or a nitride of such materials. Still alternatively, the lower electrode 120 may be formed of a conductive oxide semiconductor such as ITO (indium tin oxide), IGO (indium gallium oxide), IZO (indium zinc oxide), GZO (zinc oxide containing gallium as a dopant), or the like. The lower electrode 120 may have a structure including a stack of films of such materials.

Preferably, the material used for the lower electrode 120 is resistant to a heat treatment in a manufacturing process of a semiconductor device including a channel formed of an oxide semiconductor, and has a low contact resistance with the oxide semiconductor layer 140. As a material having a good electric contact with the oxide semiconductor layer 140, a metal material having a work function smaller than that of the oxide semiconductor layer 140 is usable.

The first insulating layer 130 may be formed of an inorganic insulating material such as SiO$_x$, SiN$_x$, SiO$_x$N$_y$, SiN$_x$O$_y$, AlO$_x$, AlN$_x$, AlO$_x$N$_y$, AlN$_x$O$_y$, or the like, like the underlying layer 110. Alternatively, the first insulating layer 130 may be formed of an organic insulating material such as a polyimide resin, an acrylic resin, an epoxy resin, a silicone resin, a fluorine resin, a siloxane resin, or the like. The first insulating layer 130 may be formed by substantially the same method as that of the underlying layer 110. The first insulating layer 130 and the underlying layer 110 may be formed of the same material as, or different materials from, each other.

In the example shown in FIG. 1, the first insulating layer 130 has a cross-section with the forward tapered first side wall 131 being linear. The structure of the first insulating layer 130 is not limited to having this structure. The forward tapered first side wall 131 may be curved as protruding outward or curved as protruding inward. Instead of being forward tapered, the first side wall 131 may be vertical with respect to the surface of the substrate 100, or reverse tapered, namely, incline while tending to close downward.

In the example shown in FIG. 1, the first insulating layer 130 is formed of a single layer. The first insulating layer 130 is not limited to having this structure, and may include a stack of a plurality of layers. In the case where the first insulating layer 130 includes a stack structure, the tapering angle and the shape of the first side wall 131 may be different layer by layer. Alternatively, the first insulating layer 130 may include a stack of layers of different properties (e.g., SiN$_x$ and SiO$_x$) such that different portions, along the first side wall 131, of the oxide semiconductor layer 140 have different properties. Namely, the semiconductor device 10 may have a channel formed of portions of the oxide semiconductor layer 140 that are of different characteristics and are connected to each other in series.

The oxide semiconductor layer 140 may be formed of a metal oxide material having the characteristics of a semiconductor. For example, the oxide semiconductor layer 140 may be formed of an oxide semiconductor containing indium (In), gallium (Ga), Zinc (Zn) and oxygen (O). Especially, the oxide semiconductor layer 140 may be formed of an oxide semiconductor having a composition ratio of In:Ga:Zn:O=1:1:1:4. It should be noted that the oxide semiconductor used in the present invention and containing In, Ga, Zn and O is not limited to having the above-described composition ratio. An oxide semiconductor having a different composition ratio is also usable. For example, in order to improve the mobility, the ratio of In may be increased. In order to increase the bandgap and thus decrease the influence of light, the ratio of Ga may be increased.

The oxide semiconductor containing In, Ga, Zn and O may contain another element added thereto. For example, a metal element such as Al, Sn or the like may be added. Instead of the above-described oxide semiconductor, zinc oxide (ZnO), nickel oxide (NiO), tin oxide (SnO$_2$), titanium oxide (TiO$_2$), vanadium oxide (VO$_2$), indium oxide (In$_2$O$_3$), strontium titanate (SrTiO$_3$), or the like may be used. The oxide semiconductor layer 140 may be amorphous or crystalline. Alternatively, the oxide semiconductor layer 140 may have a mixed phase of an amorphous phase and a crystalline phase.

The gate insulating layer 150 may be formed of an inorganic insulating material such as SiO$_x$, SiN$_x$, SiO$_x$N$_y$, SiN$_x$O$_y$, AlO$_x$, AlN$_x$, AlO$_x$N$_y$, AlN$_x$O$_y$, or the like, like the underlying layer 110 and the first insulating layer 130. Alternatively, the gate insulating layer 150 may have a structure including a stack of insulating films of such materials. The gate insulating layer 150 may be formed by substantially the same method as that of the underlying layer 110. The gate insulating layer 150, the underlying layer 110 and the first insulating layer 130 may be formed of the same material as, or different materials from, each other.

The gate electrode 160 may be formed of any of substantially the same materials as those described above regarding the lower electrode 120. The gate electrode 160 may be formed of the same material as, or a different material from, that of the lower electrode 120. Preferably, the material used for the gate electrode 160 is resistant to a heat treatment in a manufacturing process of a semiconductor device including a channel formed of an oxide semiconductor, and has a work function with which the transistor is of an enhancement type that is turned off when the gate electrode is of 0 V.

The interlayer insulating layer 170 may be formed of an inorganic insulating material such as SiO$_x$, SiN$_x$, SiO$_x$N$_y$, $SiN_xO_y$, $AlO_x$, $AlN_x$, $AlO_xN_y$, $AlN_xO_y$, or the like, like the underlying layer 110, the first insulating layer 130 and the gate insulating layer 150. The interlayer insulating layer 170 may be formed by substantially the same method as that of the underlying layer 110. Instead of the above-listed inorganic insulating materials, the interlayer insulating layer 170 may be formed of a TEOS layer or an organic insulating material. The TEOS layer refers to a CVD layer formed of TEOS (Tetra Ethyl Ortho Silicate), and has an effect of alleviating the steps of, and thus flattening, a layer therebelow. Examples of the usable organic insulating material include a polyimide resin, an acrylic resin, an epoxy resin, a silicone resin, a fluorine resin, a siloxane resin, and the like. The interlayer insulating layer 170 may be formed of a single layer or a stack of films of such materials. For example, the interlayer insulating layer 170 may include a stack of an inorganic insulating material and an organic insulating material.

The upper electrodes 180 and the first assisting electrode 190 may be formed of any of substantially the same materials as those described above regarding of the lower electrode 120 and the gate electrode 160. The upper electrodes 180 and the first assisting electrode 190 may be formed of the same material as, or a different material from, that of the lower electrode 120 and the gate electrode 160. The upper electrodes 180 and the first assisting electrode 190 may be formed of the same material as, or different materials from, each other. Alternatively, the upper electrodes 180 and the first assisting electrode 190 may be formed of copper (Cu), silver (Ag), gold (Au), or the like instead of the above-listed materials regarding the lower electrode 120 and the gate electrode 160.

Preferably, the material used for each of the upper electrodes 180 and the first assisting electrode 190 is resistant to a heat treatment in a manufacturing process of a semiconductor device including a channel formed of an oxide semiconductor, and has a low contact resistance with the oxide semiconductor layer 140. As a material having a good electric contact with the oxide semiconductor layer 140, a metal material having a work function smaller than that of the oxide semiconductor layer 140 is usable for the upper electrodes 180 and the first assisting electrode 190. The upper electrodes 180 and the first assisting electrode 190 may be formed of the same material as, or different materials from, each other. The portion of the oxide semiconductor layer 140 that is held between the upper electrode 180b and the first assisting electrode 190 may have a conductivity higher than that of the other portion of the oxide semiconductor layer 140.

[Operation of the Semiconductor Device 10]

An operation of the semiconductor device 10 shown in FIG. 1 will be described. The semiconductor device 10 is a transistor including a channel formed of the oxide semiconductor layer 140. A gate voltage is applied to the upper electrode 180c electrically connected with the gate electrode 160, a drain voltage is applied to the upper electrode 180a electrically connected with the lower electrode 120, and a source voltage is applied to the upper electrode 180b electrically connected with the oxide semiconductor layer 140. The source voltage and the drain voltage may be applied oppositely. The source voltage applied to the upper electrode 180b is supplied to the first assisting electrode 190 via the oxide semiconductor layer 140.

When the gate voltage is applied to the gate electrode 160, an electric field in accordance with the gate voltage is formed, via the gate insulating layer 150, in the portion of the oxide semiconductor layer 140 facing the gate electrode 160. The electric field generates carriers in the oxide semiconductor layer 140. When a potential difference is caused between the lower electrode 120 and the first assisting electrode 190 in the state where the carriers are generated in the oxide semiconductor layer 140, the carriers generated in the oxide semiconductor layer 140 are moved in accordance with the potential difference. Namely, electrons are moved from the first assisting electrode 190 to the lower electrode 120.

The lower electrode 120 and the first assisting electrode 190 have a conductivity higher than that of the oxide semiconductor layer 140 in which the carriers are generated. Therefore, the electrons are supplied to the oxide semiconductor layer 140 in the source region 192 and are transferred to the lower electrode 120 in the drain region 132. Namely, in the semiconductor device 10, the portion of the oxide semiconductor layer 140 that is located on the first side wall 131 of the first insulating layer 130 acts as a channel. The channel length of the semiconductor device 10 is determined by the thickness of the first insulating layer 130 and the tapering angle of the first side wall 131.

As described above, in the semiconductor device 10 in embodiment 1 according to the present invention, the portion of the oxide semiconductor layer 140 that is located on the first side wall 131 of the first insulating layer 130 acts as a channel. Therefore, the channel length of the semiconductor device 10 may be controlled by controlling either the thickness of the first insulating layer 130 or the tapering angle of the first side wall 131, or by controlling both of the thickness of the first insulating layer 130 and the tapering angle of the first side wall 131. As suggested above, the thickness of the first insulating layer 130 formed by a PVD method or a CVD method may be controlled by a nanometer order. Therefore, the semiconductor device 10 may have a channel length shorter than the limit of patterning by photolithography, by which variance is of a micrometer order. As a result, the semiconductor device 10 is capable of increasing the on-current.

The thickness of the first insulating layer 130 may be controlled by a nanometer order. Therefore, the in-plane variance of the thickness may also be controlled by a nanometer order. The tapering angle of the first side wall 131 may be controlled by the etching rate and the retraction amount of the resist for the first insulating layer 130. The variance of the etching rate and the retraction amount of the resist for the first insulating layer 130 may also be controlled by substantially the same order as the variance of the thickness of the first insulating layer 130. Therefore, the in-plane variance of the thickness of the first insulating layer 130 and the tapering angle of the first side wall 131 is smaller than the in-plane variance of the patterning precision by photolithography, which is of a micrometer order. As a result, the semiconductor device 10 is capable of suppressing the in-plane variance of the channel length. A top portion of the channel region formed of the oxide semiconductor layer 140 is covered with the gate electrode 160, and a bottom portion thereof is covered with the lower electrode 120. Therefore, in the case where the gate electrode 160 and the lower electrode 120 are formed of a light-non-transmissive metal material, the oxide semiconductor layer 140 is prevented from being irradiated with external light. As a result, the semiconductor device 10 has the characteristics thereof change little even in an environment where the semiconductor device 10 is irradiated with light.

[Manufacturing Method of the Semiconductor Device 10]

Figure 2A:
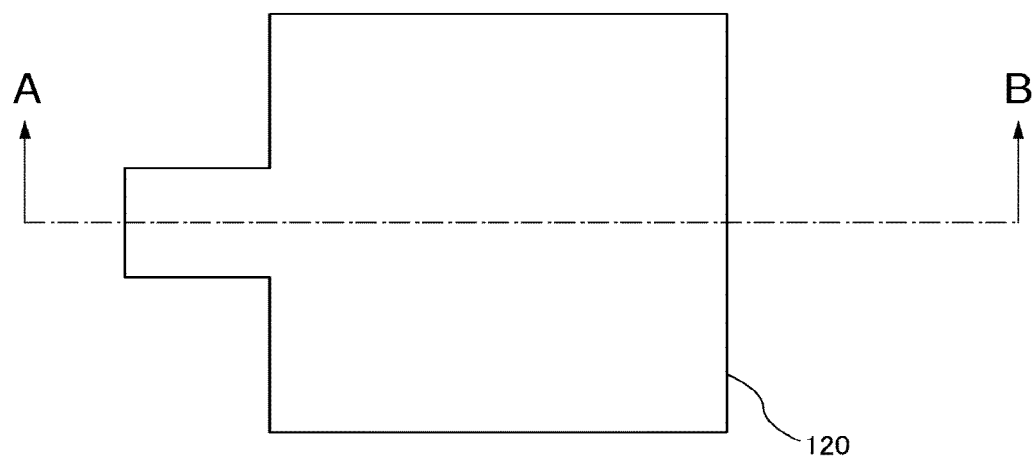
FIG. 2A is a plan view showing a step of forming a lower electrode in a manufacturing method of the semiconductor device in the embodiment according to the present invention.
Figure 2B:
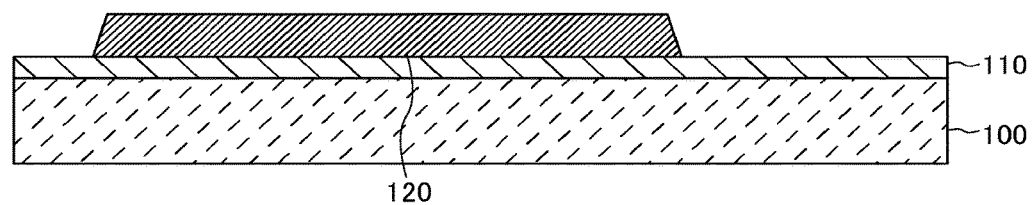
FIG. 2B is a cross-sectional view showing the step of forming the lower electrode in the manufacturing method of the semiconductor device in the embodiment according to the present invention.

With reference to plan views and cross-sectional views provided in FIG. 2 through FIG. 7, a manufacturing method of the semiconductor device 10 in embodiment 1 according to the present invention will be described. FIG. 2A and FIG. 2B (FIG. 2) are respectively a plan view and a cross-sectional view showing a step of forming the lower electrode 120 in the manufacturing method of the semiconductor device 10 in embodiment 1 according to the present invention. Referring to FIG. 2B, the underlying layer 110 and a film for the lower electrode 120 are formed on the substrate 100, and patterning is performed as shown in FIG. 2A by photolithography and etching to form the lower electrode 120. Preferably, the etching is performed to form the lower electrode 120 under the condition that the etching rate ratio of the lower electrode 120 with respect to the underlying layer 110 is high. In this and the following descriptions of manufacturing methods of semiconductor devices in embodiments according to the present invention, an assembly of the substrate 100 and the film(s) formed thereon at each step will be referred to as the "substrate" for the sake of convenience.

Figure 3A:
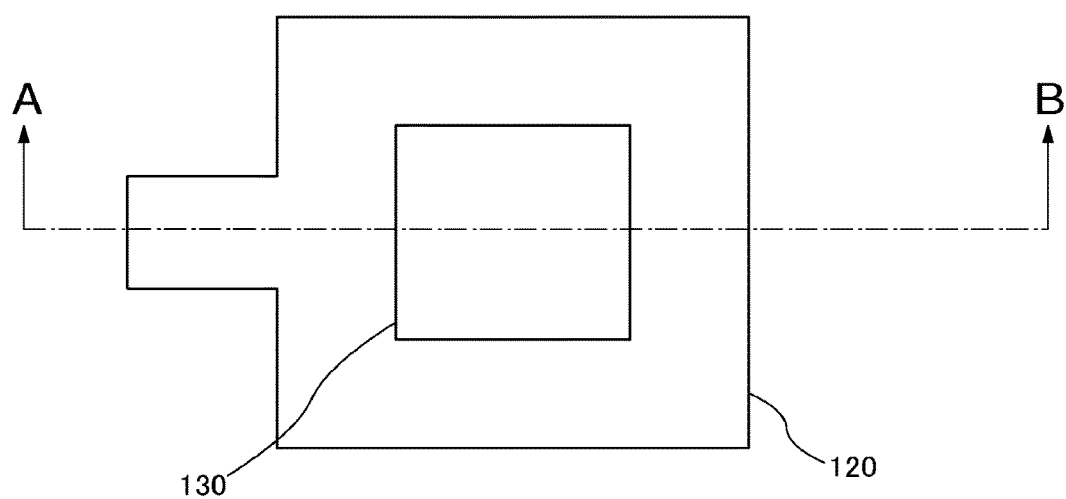
FIG. 3A is a plan view showing a step of forming a first insulating layer and a first assisting electrode in the manufacturing method of the semiconductor device in the embodiment according to the present invention.
Figure 3B:
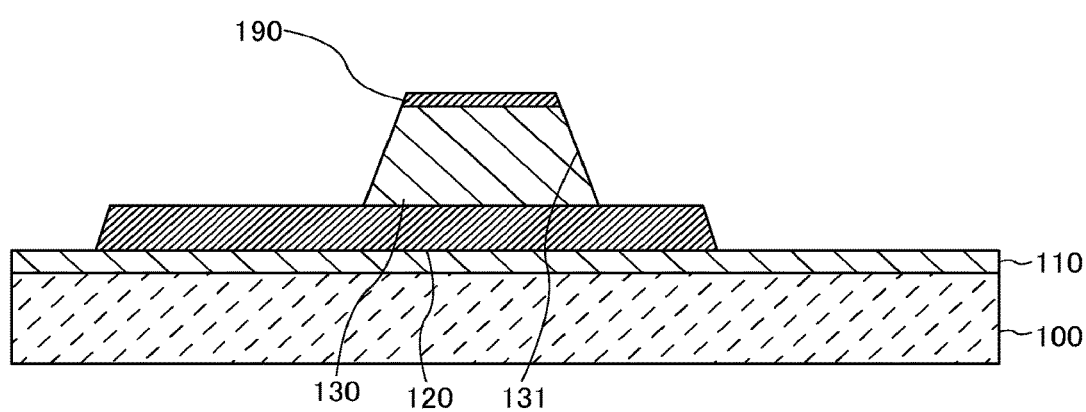
FIG. 3B is a cross-sectional view showing the step of forming the first insulating layer and the first assisting electrode in the manufacturing method of the semiconductor device in the embodiment according to the present invention.

FIG. 3A and FIG. 3B (FIG. 3) are respectively a plan view and a cross-sectional view showing a step of forming the first insulating layer 130 and the first assisting electrode 190 in the manufacturing method of the semiconductor device 10 in embodiment 1 according to the present invention. Referring to FIG. 3B, a film for the first insulating layer 130 and a film for the first assisting electrode 190 are formed on the entirety of the substrate shown in FIG. 2B, and patterning is performed as shown in FIG. 3A by photolithography and etching to form the first insulating layer 130 and the first assisting electrode 190. The first insulating layer 130 and the first assisting electrode 190 may be etched together or in separate steps. For example, after the first insulating layer 130 is formed by patterning, the film for the first assisting electrode 190 may be formed on a top surface and a side surface of the first insulating layer 130 and patterned to form the first assisting electrode 190 by photolithography and etching.

Preferably, the etching is performed to form the first insulting layer 130 under the condition that the etching rate ratio of the first insulting layer 130 with respect to at least the lower electrode 120 is high. More preferably, the etching is performed to form the first insulting layer 130 under the condition that the etching rate ratio of the first insulting layer 130 with respect to both of the lower electrode 120 and the underlying layer 110 is high. In the case where it is difficult to guarantee a high etching rate ratio of the first insulating layer 130 with respect to the underlying layer 110, for example, in the case where the first insulating layer 130 and the underlying layer 110 are formed of the same material, an etching stopper layer may be formed on the underlying layer 110. In the example shown in FIG. 3A, the pattern of the first insulating layer 130 is square. The first insulating layer 130 is not limited to being square, and may be of any of various shapes, for example, circular, elliptical, polygonal, curved or the like.

Now, an etching method for forming the first side wall 131 of the first insulating layer 130 to be tapered will be described. The tapering angle of the first side wall 131 may be controlled by the etching rate of the first insulating layer 130 and the etching rate, in a horizontal direction, of a resist used as a mask for etching the first insulating layer 130 (hereinafter, referred to as the "retraction amount of the resist"). In the case where, for example, the retraction amount of the resist is smaller than the etching rate of the first insulating layer 130, the tapering angle of the first side wall 131 is large (close to vertical). In the case where the retraction amount of the resist is zero, the first side wall 131 is vertical. By contrast, in the case where the retraction amount of the resist is larger than the etching rate of the first insulating layer 130, the tapering angle of the first side wall 131 is small (close to horizontal). The retraction amount of the resist may be adjusted by the tapering angle of an end of the resist and the etching rate of the resist.

Figure 4A:
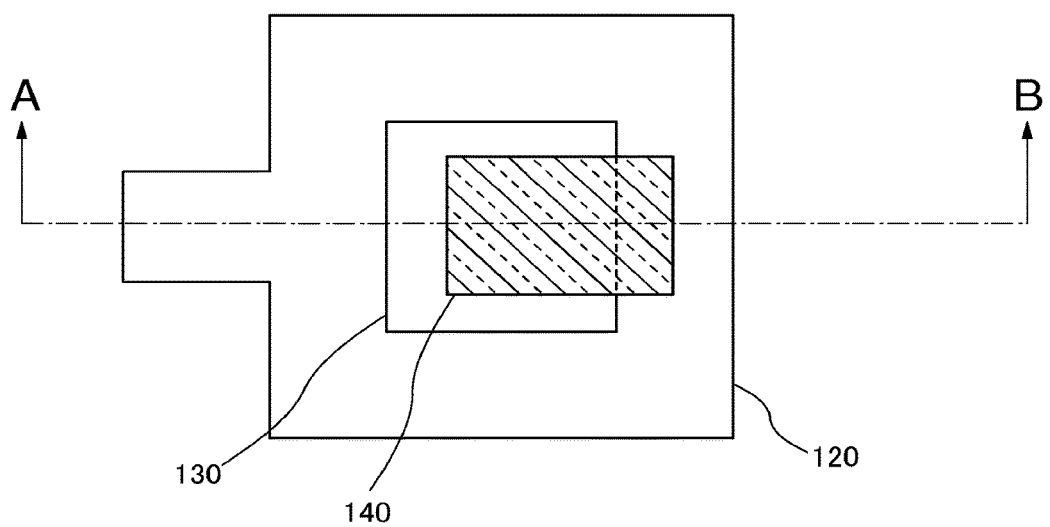
FIG. 4A is a plan view showing a step of forming an oxide semiconductor layer in the manufacturing method of the semiconductor device in the embodiment according to the present invention.
Figure 4B:
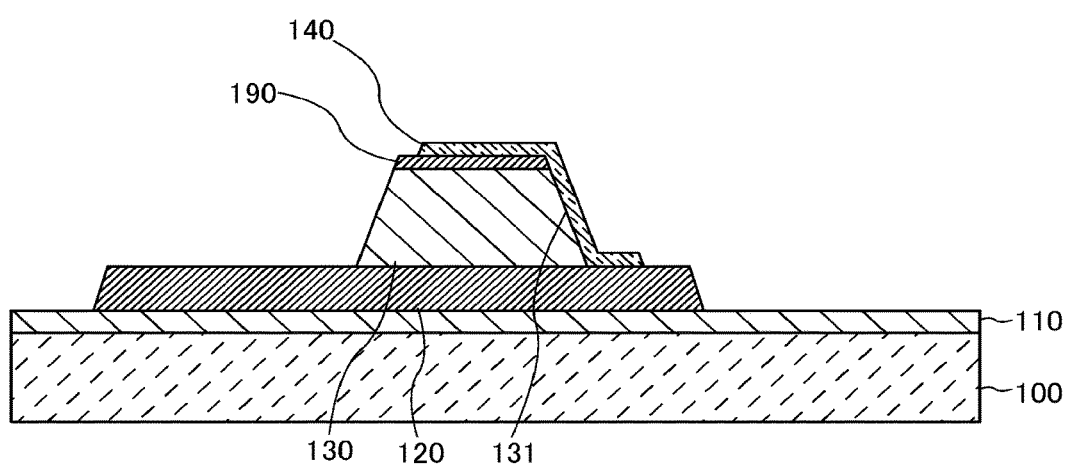
FIG. 4B is a cross-sectional view showing the step of forming the oxide semiconductor layer in the manufacturing method of the semiconductor device in the embodiment according to the present invention.

FIG. 4A and FIG. 4B (FIG. 4) are respectively a plan view and a cross-sectional view showing a step of forming the oxide semiconductor layer 140 in the manufacturing method of the semiconductor device 10 in embodiment 1 according to the present invention. Referring to FIG. 4B, a film for the oxide semiconductor layer 140 is formed on the entirety of the substrate shown in FIG. 3B, and patterning is performed as shown in FIG. 4A by photolithography and etching to form the oxide semiconductor layer 140. The oxide semiconductor layer 140 may be formed by sputtering. The etching performed to form the oxide semiconductor layer 140 may be dry etching or wet etching. In the case where the oxide semiconductor layer 140 is formed by wet etching, an etchant containing oxalic acid may be used.

In the example shown in FIG. 4A and FIG. 4B, the oxide semiconductor layer 140 is formed on one side surface of the first insulating layer 130. The oxide semiconductor layer 140 is not limited to having this structure. For example, the oxide semiconductor layer 140 may be formed so as to cover the first insulating layer 130, namely, may be formed on the entirety of the first side wall 131 of the first insulating layer 130.

Figure 5A:
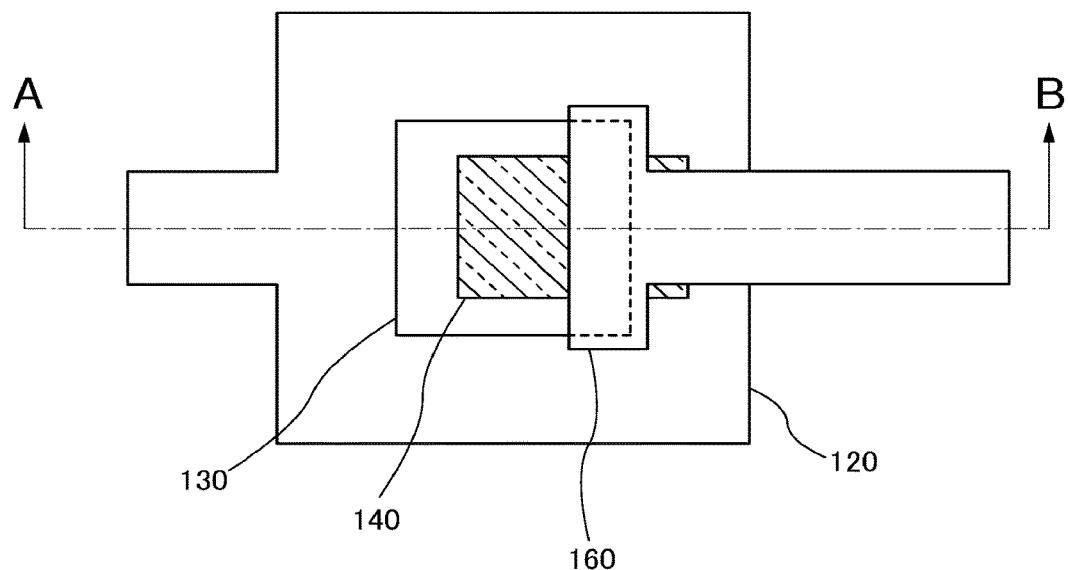
FIG. 5A is a plan view showing a step of forming a gate insulating layer and a gate electrode in the manufacturing method of the semiconductor device in the embodiment according to the present invention.
Figure 5B:
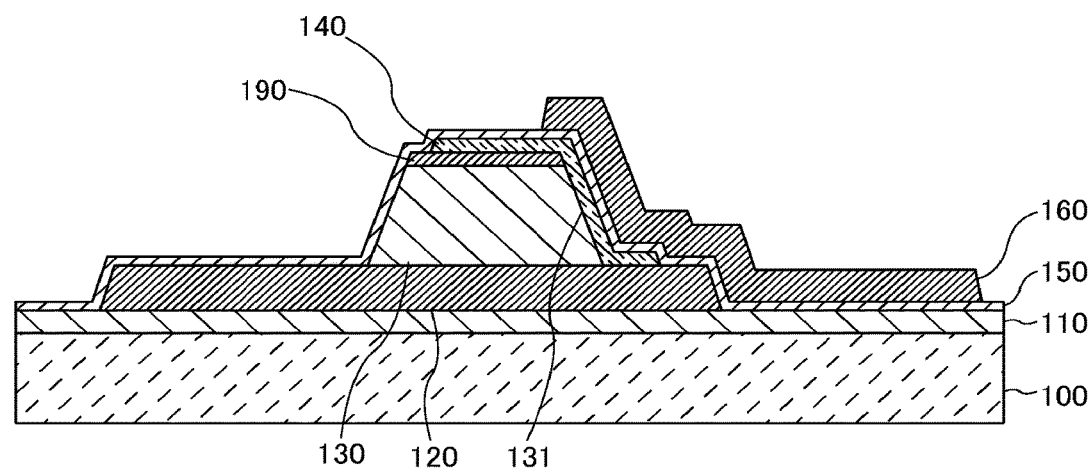
FIG. 5B is a cross-sectional view showing the step of forming the gate insulating layer and the gate electrode in the manufacturing method of the semiconductor device in the embodiment according to the present invention.

FIG. 5A and FIG. 5B (FIG. 5) are respectively a plan view and a cross-sectional view showing a step of forming the gate insulating layer 150 and the gate electrode 160 in the manufacturing method of the semiconductor device 10 in embodiment 1 according to the present invention. Referring to FIG. 5B, the gate insulating layer 150 and a film for the gate electrode 160 are formed on the entirety of the substrate shown in FIG. 4B, and patterning is performed as shown in FIG. 5A by photolithography and etching to form the gate electrode 160. In the example shown in FIG. 5B, the gate insulating layer 150 acts as an etching stopper for the gate electrode 160, and only the film for the gate electrode 160 is etched. Alternatively, both of the gate insulating layer 150 and the gate electrode 160 may be formed together by etching.

As shown in FIG. 5A, the gate electrode 160 is formed so as to cover an end, in a channel width direction (W length direction; namely, direction perpendicular to A-B direction in FIG. 5A), of the oxide semiconductor layer 140. In other words, the gate electrode 160 of the semiconductor device 10 is longer in the W length direction than the channel provided by the oxide semiconductor layer 140. In still other words, the gate electrode 160 is longer in the W length direction than the oxide semiconductor layer 140 on the first side wall 131. During the etching performed to form the oxide semiconductor layer 140, the end of the oxide semiconductor layer 140 may possibly have properties thereof changed. The gate electrode 160 formed in the pattern as shown in FIG. 5A suppresses a leak path from being formed at the end of the oxide semiconductor layer 140 even when the end of the oxide semiconductor layer 140 has many defects by the influence of the etching.

Figure 6A:
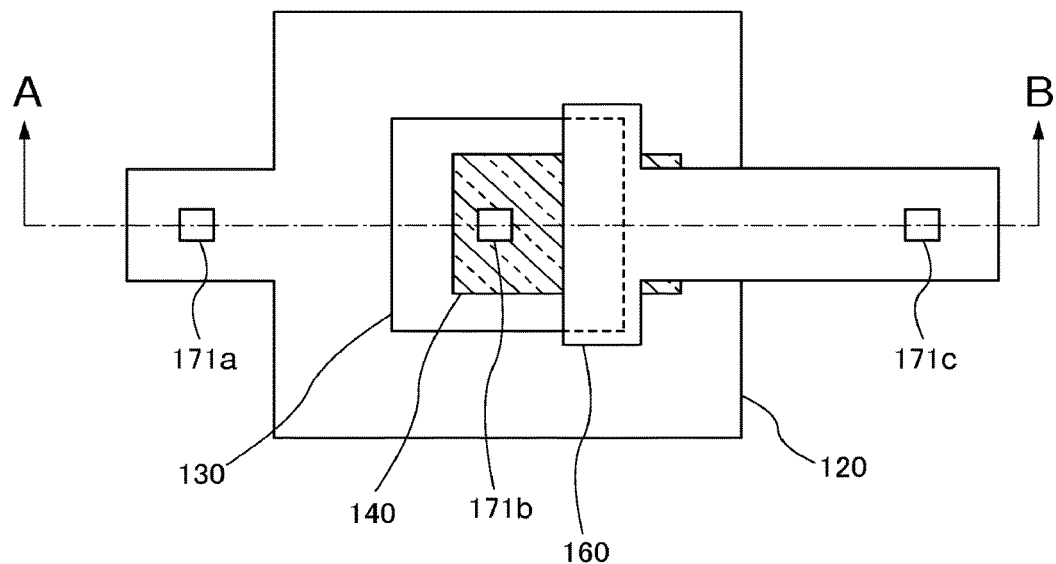
FIG. 6A is a plan view showing a step of forming an interlayer insulating layer and also forming openings in the interlayer insulating layer and the gate insulating layer in the manufacturing method of the semiconductor device in the embodiment according to the present invention.
Figure 6B:
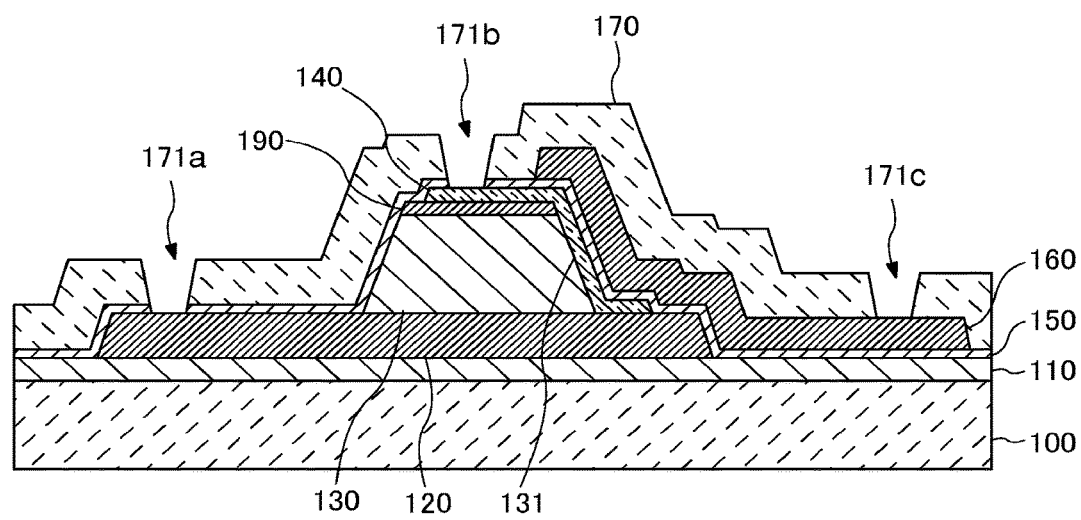
FIG. 6B is a cross-sectional view showing the step of forming the interlayer insulating layer and also forming the openings in the interlayer insulating layer and the gate insulating layer in the manufacturing method of the semiconductor device in the embodiment according to the present invention.

FIG. 6A and FIG. 6B (FIG. 6) are respectively a plan view and a cross-sectional view showing a step of forming the interlayer insulating layer 170 and also forming the openings 171 in the interlayer insulating layer 170 and the gate insulating layer 150 in the manufacturing method of the semiconductor device 10 in embodiment 1 according to the present invention. Referring to FIG. 6B, the interlayer insulating layer 170 is formed on the entirety of the substrate shown in FIG. 5B, and patterning is performed as shown in FIG. 6A by photolithography and etching to form the openings 171. The opening 171a exposes the lower electrode 120, the opening 171b exposes the oxide semiconductor layer 140, and the opening 171c exposes the gate electrode 160. Preferably, the etching rate ratio of the gate insulating layer 150 and the interlayer insulating layer 170 with respect to the lower electrode 120, the oxide semiconductor layer 140 and the gate electrode 160 is high.

Figure 7A:
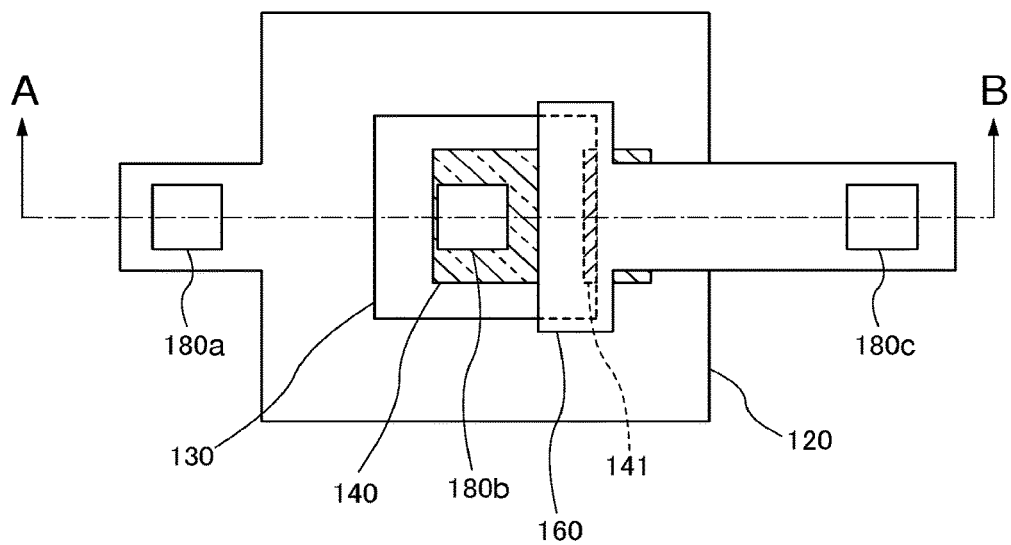
FIG. 7A is a plan view showing a step of forming upper electrodes in the manufacturing method of the semiconductor device in the embodiment according to the present invention.
Figure 7B:
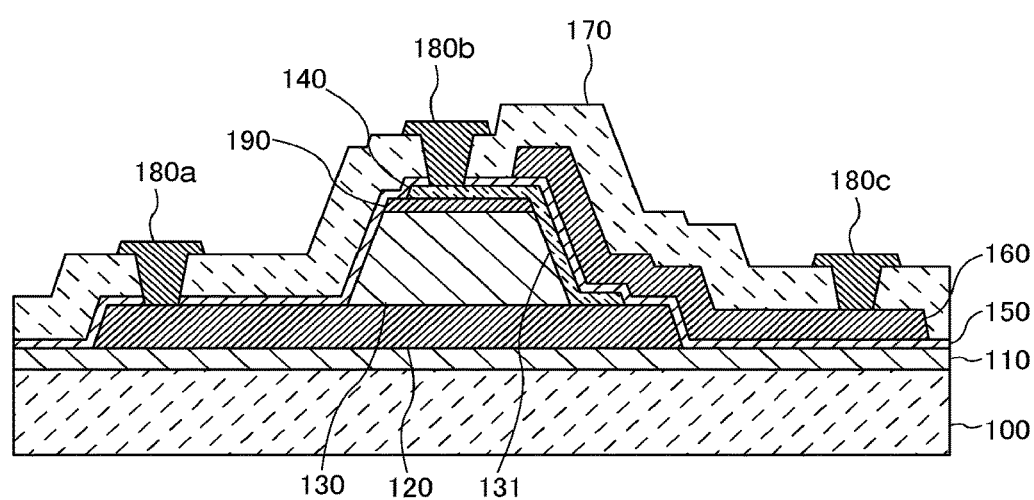
FIG. 7B is a cross-sectional view showing the step of forming the upper electrodes in the manufacturing method of the semiconductor device in the embodiment according to the present invention.

FIG. 7A and FIG. 7B (FIG. 7) are respectively a plan view and a cross-sectional view showing a step of forming the upper electrodes 180 in the manufacturing method of the semiconductor device 10 in embodiment 1 according to the present invention. Referring to FIG. 7B, a film for the upper electrodes 180 is formed on the entirety of the substrate shown in FIG. 6B, and patterning is performed as shown in FIG. 7A by photolithography and etching to form the upper electrodes 180.

The semiconductor device 10 in embodiment 1 according to the present invention is manufactured by the manufacturing method described above. Referring to FIG. 7B, the portion of the oxide semiconductor layer 140 that is located on the first side wall 131 is a channel region 141 (FIG. 7A). Namely, as shown in FIG. 7A, the channel region 141 is formed in an area of the oxide semiconductor layer 140 that is covered with the gate electrode 160, and the end of the oxide semiconductor layer 140 is included in the channel region 141.

<Modifications of Embodiment 1>

Figure 8:
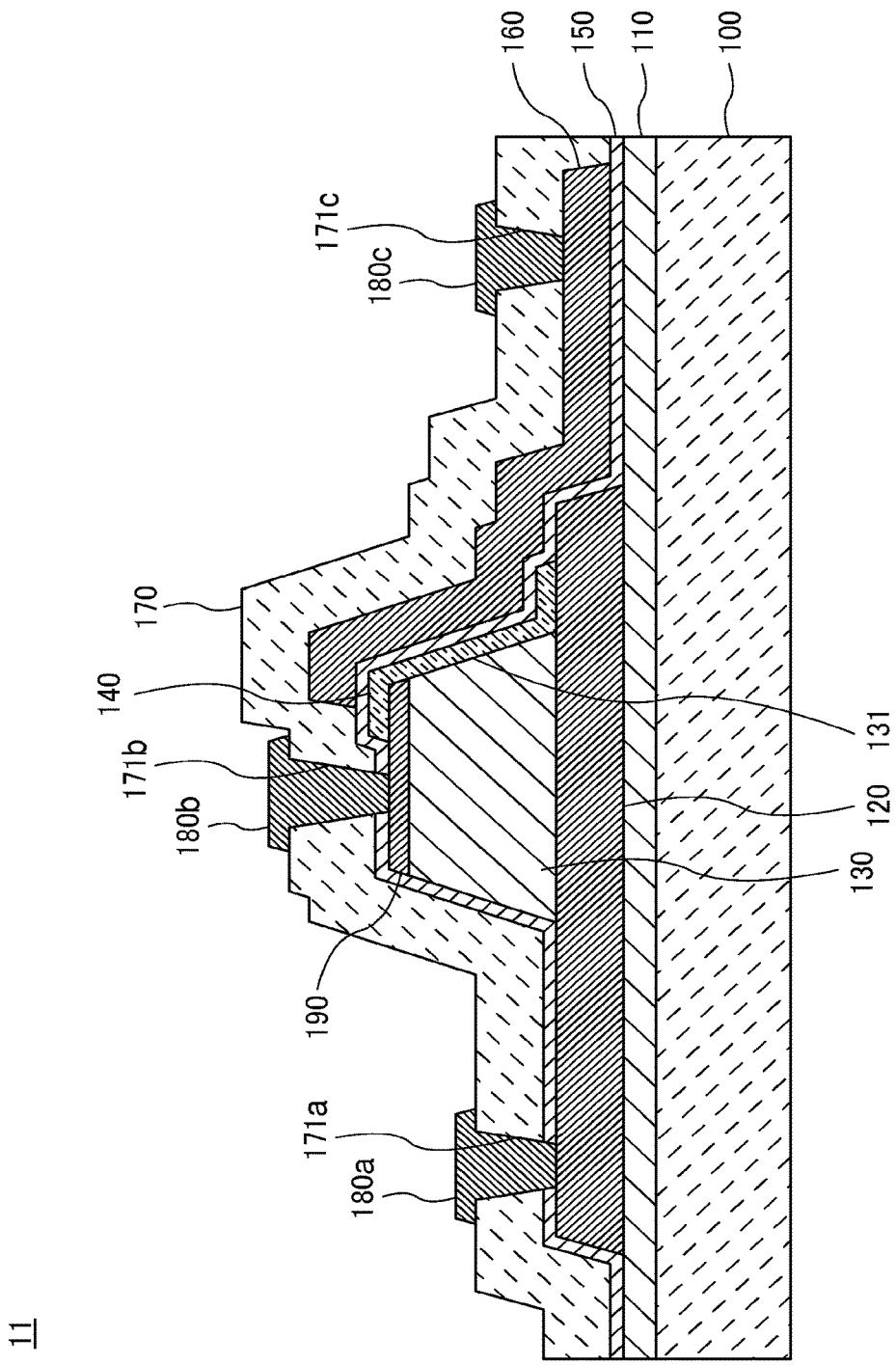
FIG. 8 is a cross-sectional view showing an overview of a semiconductor device in an embodiment according to the present invention.
Figure 9:
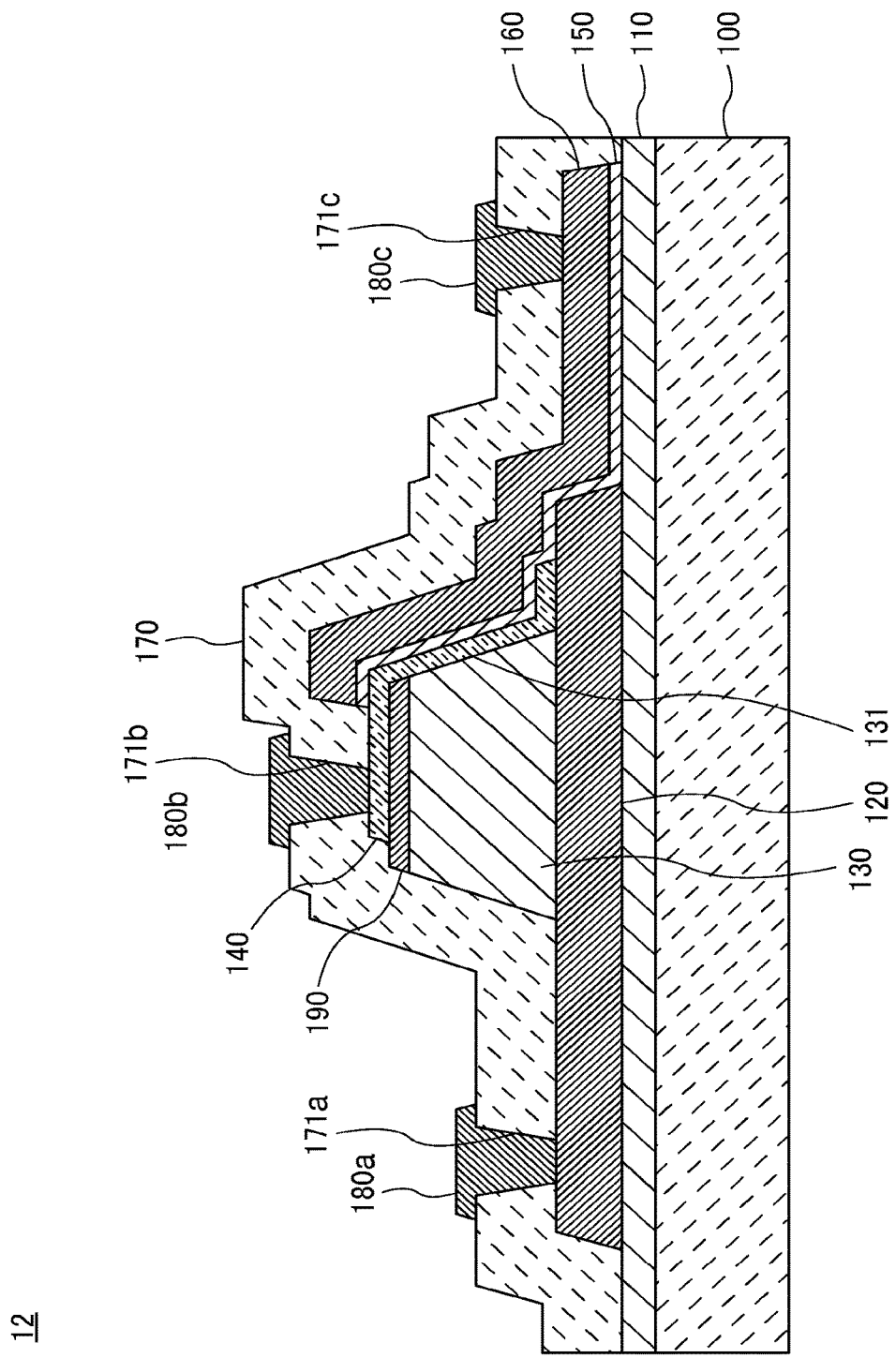
FIG. 9 is a cross-sectional view showing an overview of a semiconductor device in an embodiment according to the present invention.
Figure 10:
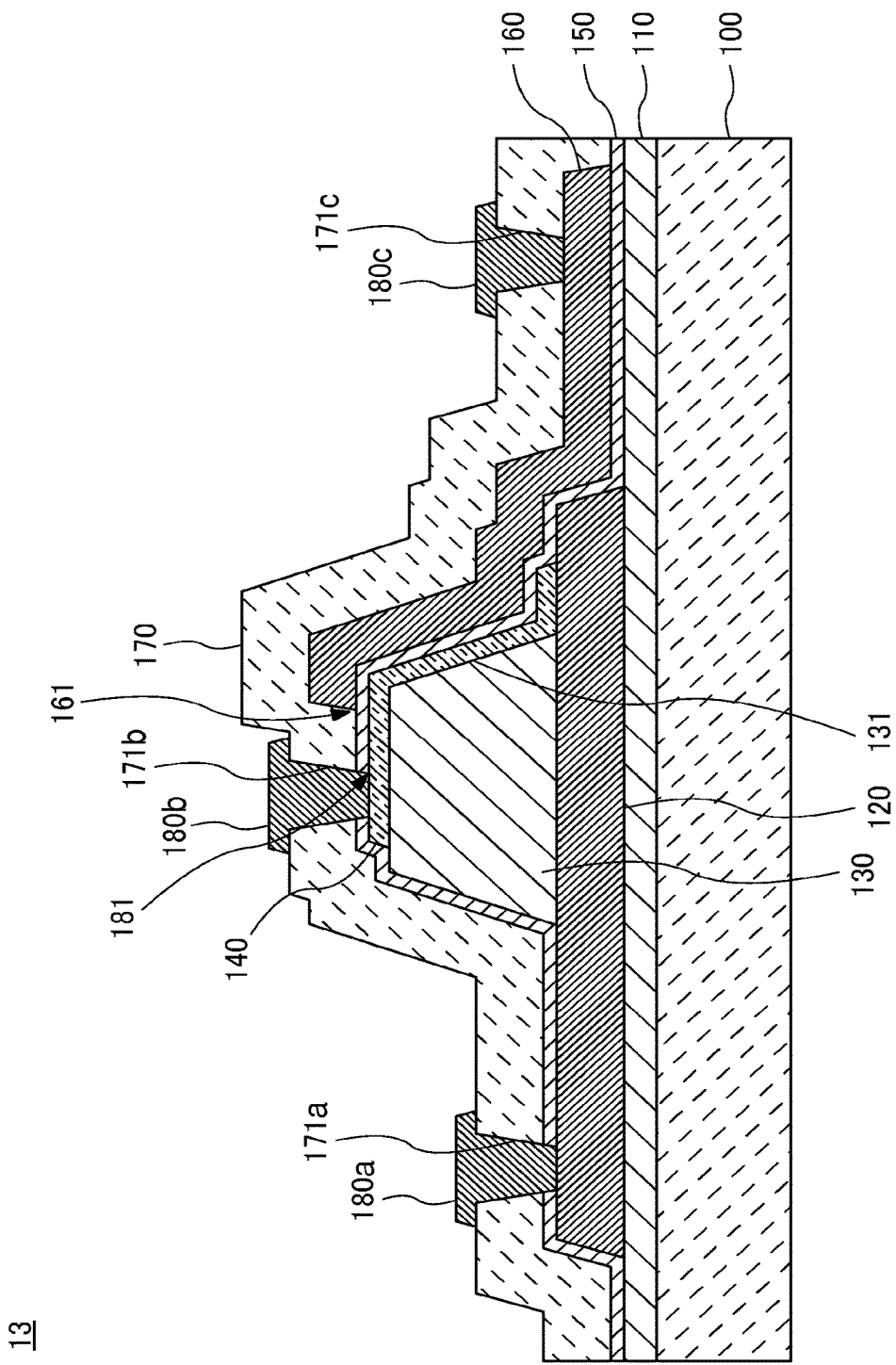
FIG. 10 is a cross-sectional view showing an overview of a semiconductor device in an embodiment according to the present invention.

With reference to FIG. 8 through FIG. 10, modifications of embodiment 1 will be described. A semiconductor device 11 in modification 1 of embodiment 1 is similar to the semiconductor device 10 in embodiment 1. In the following description, the identical elements to, or the elements having the identical functions to, those of the semiconductor device 10 will bear the identical reference numerals thereto, and detailed descriptions thereof will be omitted.

FIG. 8 is a cross-sectional view showing an overview of the semiconductor device 11 in modification 1 of embodiment 1 according to the present invention. As shown in FIG. 8, in the semiconductor device 11, unlike in the semiconductor device 10 shown in FIG. 1, the upper electrode 180b is connected with the first assisting electrode 190, not with the oxide semiconductor layer 140. In the semiconductor device 11, it is sufficient that the oxide semiconductor layer 140 is in contact with the first assisting electrode 190 and does not need to overlap the upper electrode 180b as seen in a plan view. Namely, unlike in the semiconductor device 10 shown in FIG. 1, the upper electrode 180b does not need to be located above the oxide semiconductor layer 140.

As described above, in the semiconductor device 11 in modification 1 of embodiment 1, the upper electrode 180b is in contact with the first assisting electrode 190. Therefore, the contact resistance is further decreased. As a result, the semiconductor device 11 is capable of further increasing the on-current.

FIG. 9 is a cross-sectional view showing an overview of a semiconductor device 12 in modification 2 of embodiment 1 according to the present invention. As shown in FIG. 9, in the semiconductor device 12, unlike in the semiconductor device 10 shown in FIG. 1, the gate insulating layer 150 and the gate electrode 160 have ends thereof flush. Although not shown, in the semiconductor device 12, the gate insulating layer 150 and the gate electrode 160 have substantially the same pattern as seen in a plan view. The semiconductor device 12 may be manufactured by, for example, forming the gate electrode 160 and the gate insulating layer 150 at the same time by etching in the step shown in FIG. 5B, or by performing etching to form the gate insulating layer 150 using, as a mask, the gate electrode 160 that is patterned as shown in FIG. 5B.

As described above, in the semiconductor device 12 in modification 2 of embodiment 1, the openings 171a and 171b are formed in the same layer structure as the opening 171c in the step of forming the openings 171 shown in FIG. 6B. Therefore, the condition of etching performed to form the openings 171 is adjusted easily.

FIG. 10 is a cross-sectional view showing an overview of a semiconductor device 13 in modification 3 of embodiment 1 according to the present invention. As shown in FIG. 10, in the semiconductor device 13, unlike in the semiconductor device 10 shown in FIG. 1, the oxide semiconductor layer 140 is located above the first insulating layer 130, without the first assisting electrode 190 being provided. Namely, the upper electrode 180b is connected at a position above the first insulating layer 130, with the oxide semiconductor layer 140. In the semiconductor device 13, an offset region in which no electric field is formed by the gate voltage applied to the gate electrode 160 is present between an end 161 of the gate electrode 160 and an end 181 of the upper electrode 180b. In order to provide a higher on-current, the oxide semiconductor layer 140 having a conductivity higher than that of the channel may be provided in the offset region. The oxide semiconductor layer 140 having such a high conductivity may be formed by, for example, implanting impurities that generate carriers into the oxide semiconductor layer 140 from above using the gate electrode 160 as a mask in the step shown in FIG. 5B, or by incorporating hydrogen into the interlayer insulating layer 170 to form an inorganic insulating film of $SiN_x$ or the like.

As described above, in the semiconductor device 13 in modification 3 of embodiment 1, the first assisting electrode 190 does not need to be formed above the first insulating layer 130. This eliminates the step of forming the film for the first assisting electrode 190 and performing the patterning to form the first assisting electrode 190. This shortens the manufacturing process. Since the first assisting electrode 190 is not located above the first insulating layer 130, the shape of the first insulating layer 130 is adjusted easily.

Embodiment 2

Figure 11:
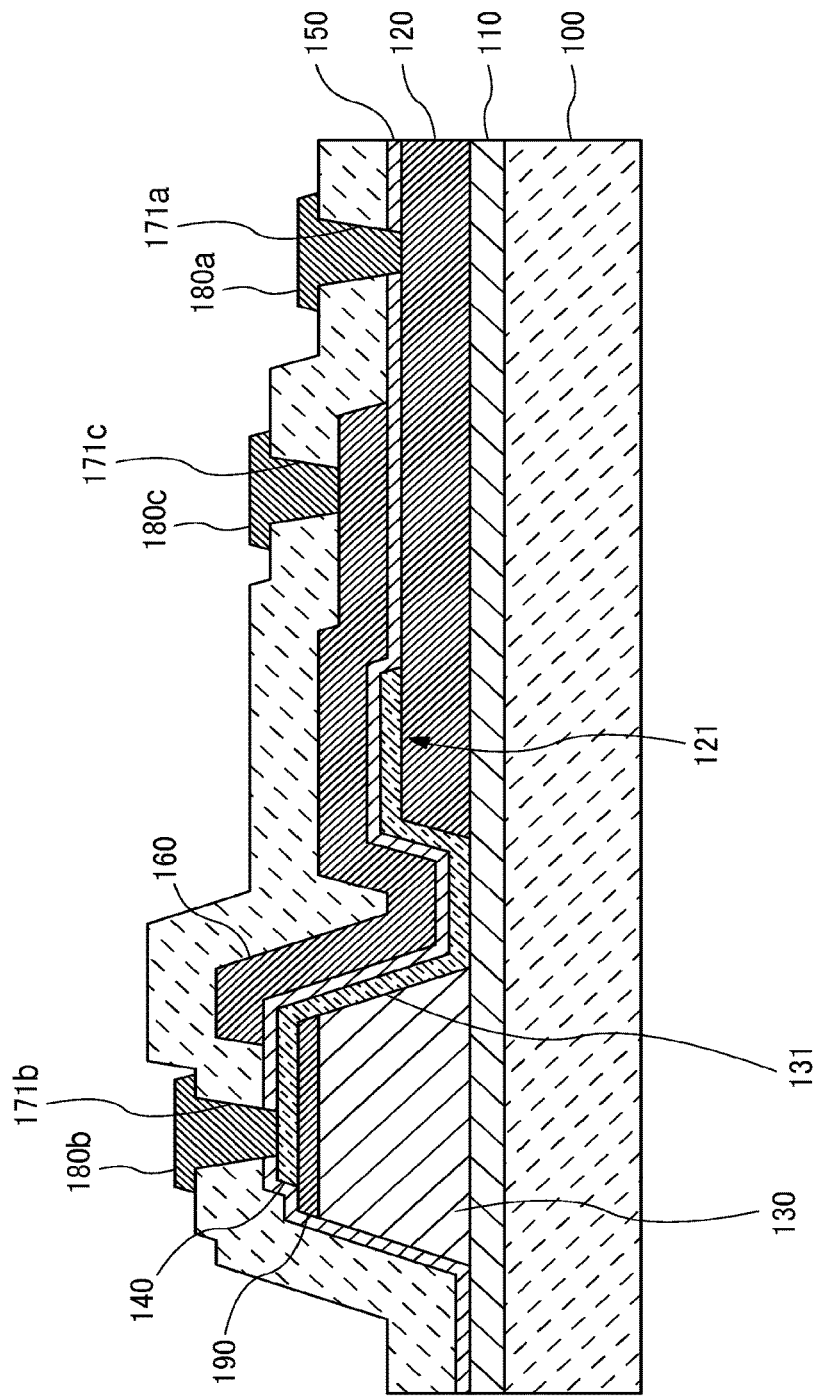
FIG. 11 is a cross-sectional view showing an overview of a semiconductor device in an embodiment according to the present invention.

With reference to FIG. 11, an overview of a semiconductor device 20 in embodiment 2 according to the present invention will be described. The semiconductor device 20 in embodiment 2 is usable in a display device or a driving circuit, like the semiconductor layer 10 in embodiment 1. The semiconductor device 20 in embodiment 2 is described as having a structure including a channel formed of an oxide semiconductor. The semiconductor device 20 in embodiment 2 is not limited to having such a structure, and may include a channel formed of, for example, a semiconductor such as silicon or the like, a compound semiconductor such as Ga—As or the like, or an organic semiconductor such as pentacene, tetracyanoquinodimethane (TCNQ) or the like. In embodiment 2, the semiconductor device 20 is a transistor. This does not limit the semiconductor device according to the present invention to a transistor.

[Structure of the Semiconductor Device 20]

FIG. 11 is a cross-sectional view showing an overview of the semiconductor device 20 in embodiment 2 according to the present invention. As shown in FIG. 11, the semiconductor device 20 includes a substrate 100, an underlying layer 110 located on the substrate 100, a lower electrode 120 located on the underlying layer 110, a first insulating layer 130 located on the lower electrode 120 and having a first side wall 131, a first assisting electrode 190 located above the first insulating layer 130, and an oxide semiconductor layer 140 located on the first assisting electrode 190, the first side wall 131, the underlying layer 110 and the lower electrode 120 and connected with the lower electrode 120 in a region 121. At a position between the first insulating layer 130 and the lower electrode 120, the oxide semiconductor layer 140 is in contact with the underlying layer 110.

The semiconductor device 20 also includes a gate insulating layer 150 located opposite to the underlying layer 110, the lower electrode 120 and the first insulating layer 130 while having the oxide semiconductor layer 140 therebetween, and a gate electrode 160 facing portions of the oxide semiconductor layer 140 while having the gate insulating layer 150 therebetween. The portions of the oxide semiconductor layer 140 facing the gate electrode 160 are located on a portion of the underlying layer 120 that is between the first insulating layer 130 and the lower electrode 120, and on the first side wall 131. The semiconductor device 20 further includes an interlayer insulating layer 170 located on the gate electrode 160, and upper electrodes 180 located in openings 171 formed in the interlayer insulating layer 170. The upper electrodes 180 are respectively connected with the lower electrode 120, the oxide semiconductor layer 140 and the gate electrode 160. Namely, a part of the upper electrodes 180 is located above the oxide semiconductor layer 140. The oxide semiconductor layer 140 includes a portion (first portion) thereof connected with the lower electrode 120 in the region 121 and another portion (second portion) thereof connected with the upper electrode 180b and the first assisting electrode 190. In other words, the upper electrode 180b is connected with the oxide semiconductor layer 140 on a side opposite to the first assisting electrode 190.

The substrate 100, the underlying layer 110, the lower electrode 120, the first insulating layer 130, the oxide semiconductor layer 140, the gate insulating layer 150, the gate electrode 160, the interlayer insulating layer 170, the upper electrodes 180, and the first assisting electrode 190 may each be formed of any of the materials described in embodiment 1.

Regarding the oxide semiconductor layer 140, the portion thereof located on the first side wall 131 and the portion thereof located on the underlying layer 110 may have different properties from each other. Namely, the semiconductor device 20 may have a channel formed of portions of the oxide semiconductor layer 140 that are of different characteristics connected to each other in series. For example, in the case where the portion of the oxide semiconductor layer 140 located on the first side wall 131 has few defects and a low off-current (leak current), the portion of the oxide semiconductor layer 140 located on the underlying layer 110 may have many defects and a high off-current (leak current). Namely, the specific electrical resistance of the portion of the oxide semiconductor layer 140 located on the underlying layer 110 may be smaller than the specific electrical resistance of the portion of the oxide semiconductor layer 140 located on the first side wall 131. In other words, the portions of the oxide semiconductor layer 140 that are different in the level of the off-current (leak current) caused by the defects of the oxide semiconductor or in the specific electrical resistance in accordance with the layer therebelow may be connected to each other in series. Needless to say, the portion of the oxide semiconductor layer 140 located on the first side wall 131 may have many defects and a low specific electrical resistance, whereas the portion of the oxide semiconductor layer 140 located on the underlying layer 110 may have few defects and a low off-current.

As described above, in the semiconductor device 20 in embodiment 2 according to the present invention, the portions of the oxide semiconductor layer 140 located on the first side wall 131 and the underlying layer 110 act as a channel. Therefore, the channel length of the semiconductor device 20 is controlled easily, which provides substantially the same effect as that of embodiment 1. The lower electrode 120 and the first insulating layer 130 do not need to be stacked, which allows the semiconductor device 20 to have any of various layouts. Namely, the degree of designing freedom is improved.

[Manufacturing Method of the Semiconductor Device 20]

Figure 12A:
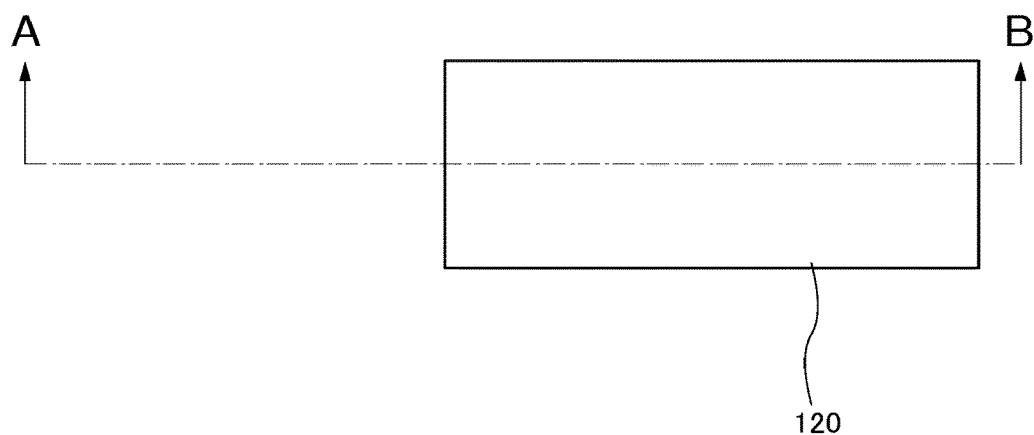
FIG. 12A is a plan view showing a step of forming a lower electrode in a manufacturing method of the semiconductor device in the embodiment according to the present invention.
Figure 12B:
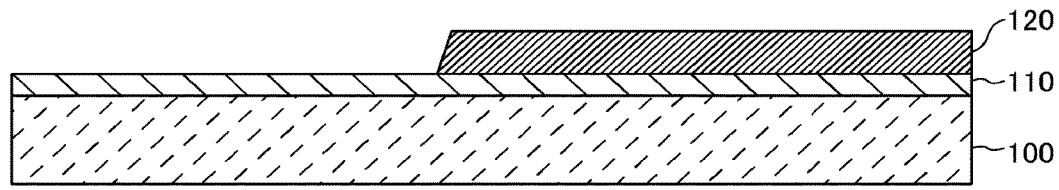
FIG. 12B is a cross-sectional view showing the step of forming the lower electrode in the manufacturing method of the semiconductor device in the embodiment according to the present invention.

With reference to plan views and cross-sectional views provided in FIG. 12 through FIG. 17, a manufacturing method of the semiconductor device 20 in embodiment 2 according to the present invention will be described. The manufacturing method of the semiconductor device 20 shown in FIG. 11 is similar to the manufacturing method of the semiconductor device 10 shown in FIG. 1, and thus will not be described in detail. FIG. 12A and FIG. 12B (FIG. 12) are respectively a plan view and a cross-sectional view showing a step of forming the lower electrode 120 in the manufacturing method of the semiconductor device 20 in embodiment 2 according to the present invention. First, referring to FIG. 12B, the underlying layer 110 and a film for the lower electrode 120 are formed on the substrate 100, and patterning is performed as shown in FIG. 12A by photolithography and etching to form the lower electrode 120. In the case where the specific electrical resistance of the oxide semiconductor layer 140 that is to be located on the underlying layer 110 in a later step is to be made small, the underlying layer 110 may be formed of an inorganic insulating material such as hydrogen-containing $SiN_x$ or the like.

Figure 13A:
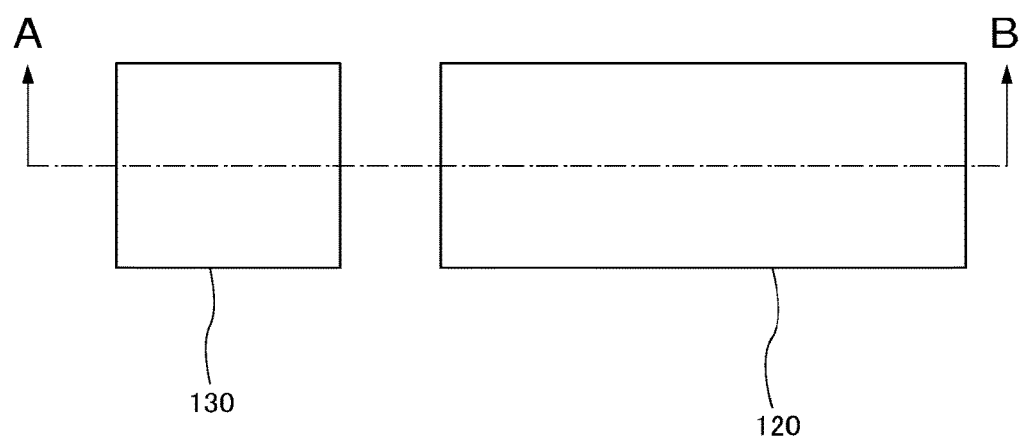
FIG. 13A is a plan view showing a step of forming a first insulating layer and a first assisting electrode in the manufacturing method of the semiconductor device in the embodiment according to the present invention.
Figure 13B:
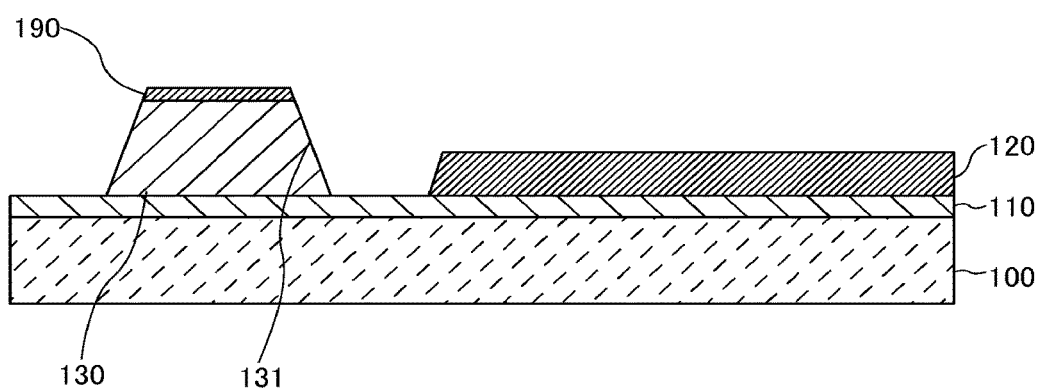
FIG. 13B is a cross-sectional view showing the step of forming the first insulating layer and the first assisting electrode in the manufacturing method of the semiconductor device in the embodiment according to the present invention.

FIG. 13A and FIG. 13B (FIG. 13) are respectively a plan view and a cross-sectional view showing a step of forming the first insulating layer 130 and the first assisting electrode 190 in the manufacturing method of the semiconductor device 20 in embodiment 2 according to the present invention. Referring to FIG. 13B, a film for the first insulating layer 130 and a film for the first assisting electrode 190 are formed on the entirety of the substrate shown in FIG. 12B, and patterning is performed as shown in FIG. 13A by photolithography and etching to form the first insulating layer 130 and the first assisting electrode 190. The lower electrode 120 is separate from the first insulating layer 130 and the first assisting electrode 190. Therefore, in the case where the first insulating layer 130 and the underlying layer 110 are formed of the same material and thus it is difficult to guarantee a high etching rate ratio of the first insulating layer 130 with respect to the underlying layer 110, the patterning to form the lower electrode 120 may be performed after the patterning to form the first insulating layer 130 and the first assisting electrode 190 is performed, unlike according to the method shown in FIG. 12 and FIG. 13.

Figure 14A:
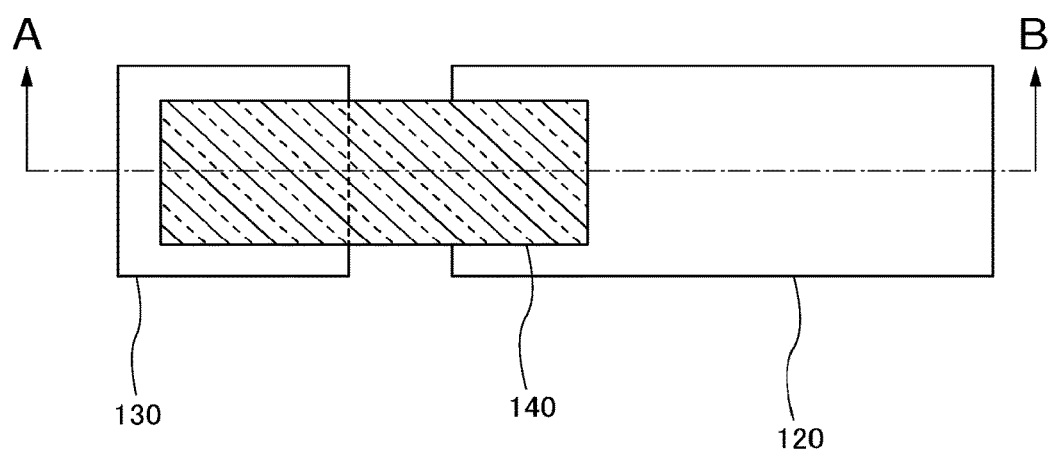
FIG. 14A is a plan view showing a step of forming an oxide semiconductor layer in the manufacturing method of the semiconductor device in the embodiment according to the present invention.
Figure 14B:
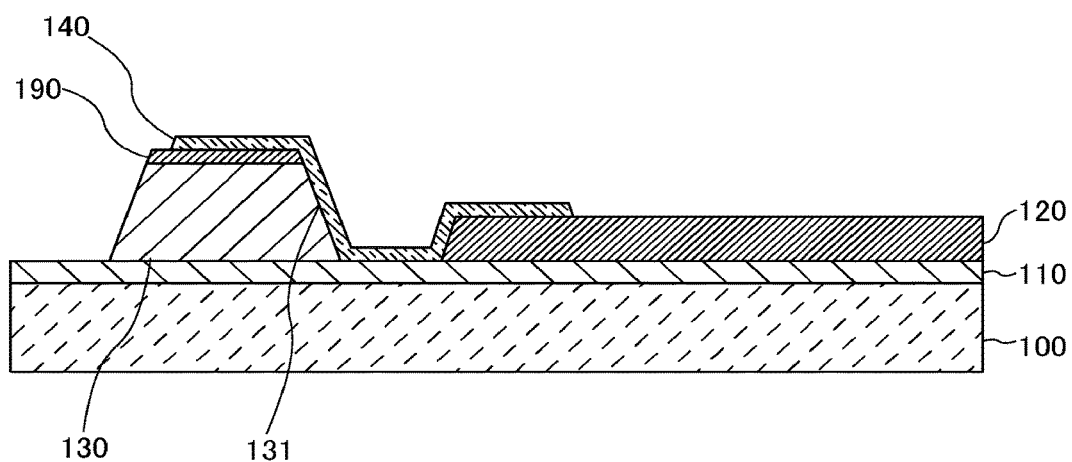
FIG. 14B is a cross-sectional view showing the step of forming the oxide semiconductor layer in the manufacturing method of the semiconductor device in the embodiment according to the present invention.

FIG. 14A and FIG. 14B (FIG. 14) are respectively a plan view and a cross-sectional view showing a step of forming the oxide semiconductor layer 140 in the manufacturing method of the semiconductor device 20 in embodiment 2 according to the present invention. Referring to FIG. 14B, a film for the oxide semiconductor layer 140 is formed on the entirety of the substrate shown in FIG. 13B, and patterning is performed as shown in FIG. 14A by photolithography and etching to form the oxide semiconductor layer 140.

Figure 15A:
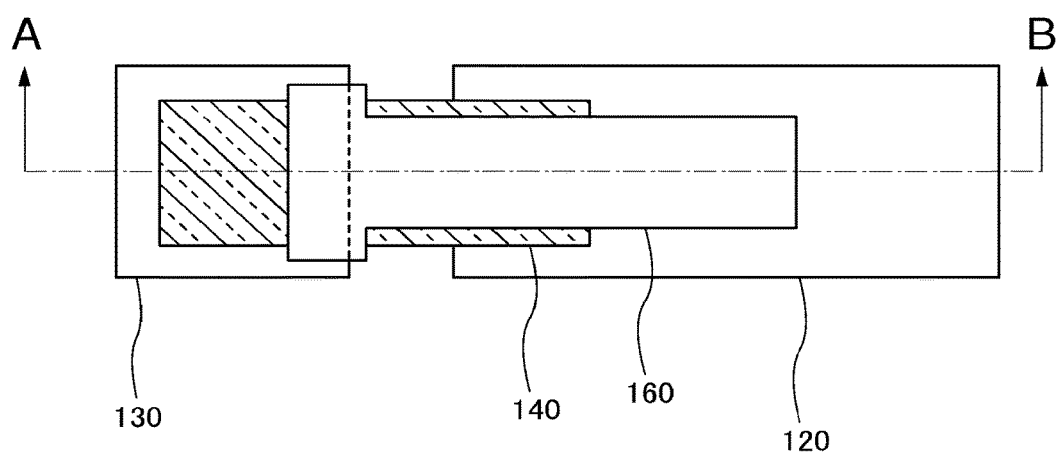
FIG. 15A is a plan view showing a step of forming a gate insulating layer and a gate electrode in the manufacturing method of the semiconductor device in the embodiment according to the present invention.
Figure 15B:
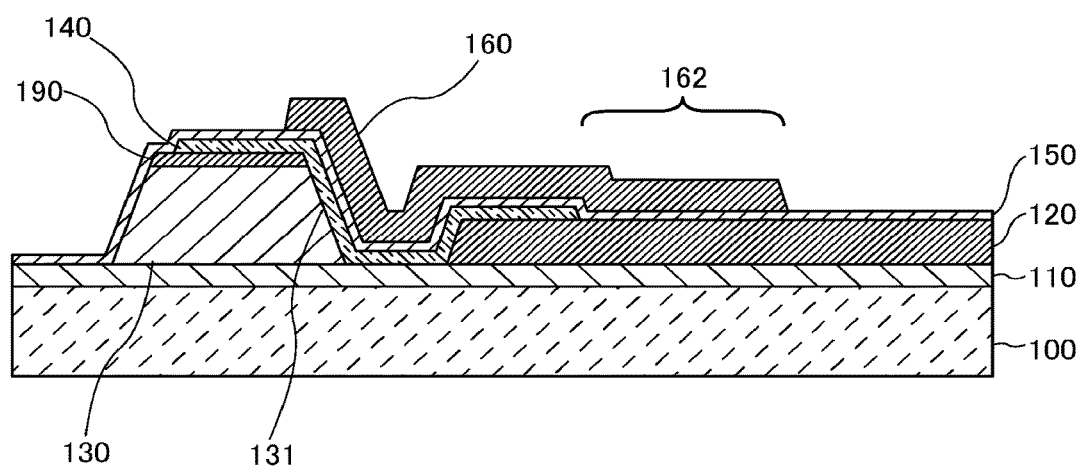
FIG. 15B is a cross-sectional view showing the step of forming the gate insulating layer and the gate electrode in the manufacturing method of the semiconductor device in the embodiment according to the present invention.

FIG. 15A and FIG. 15B (FIG. 15) are respectively a plan view and a cross-sectional view showing a step of forming the gate insulating layer 150 and the gate electrode 160 in the manufacturing method of the semiconductor device 20 in embodiment 2 according to the present invention. Referring to FIG. 15B, the gate insulating layer 150 and a film for the gate electrode 160 are formed on the entirety of the substrate shown in FIG. 14B, and patterning is performed as shown in FIG. 15A by photolithography and etching to form the gate electrode 160. The gate electrode 160 extends over an end, in a direction of the L length, of the oxide semiconductor layer 140 and faces the lower electrode 120 in a region 162 while having the gate insulating layer 150 therebetween. Namely, the region 162 may act as a capacitor using the gate insulating layer 150 as a dielectric element.

Figure 16A:
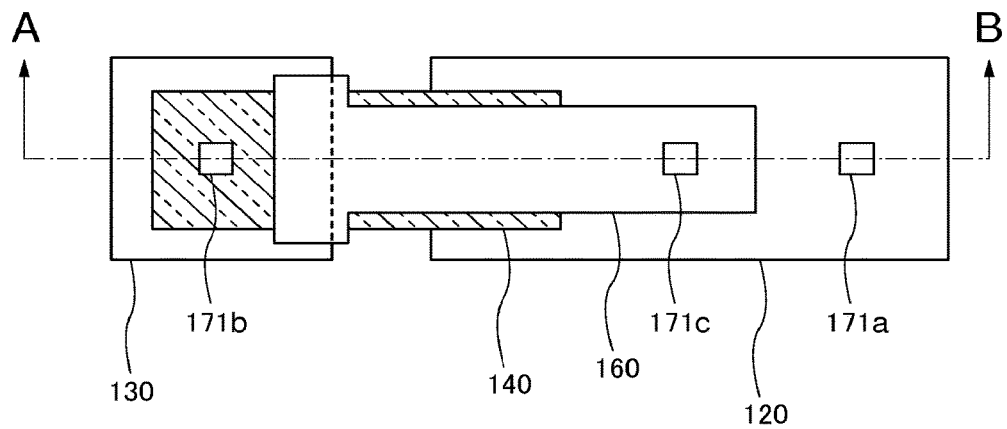
FIG. 16A is a plan view showing a step of forming an interlayer insulating layer and also forming openings in the interlayer insulating layer and the gate insulating layer in the manufacturing method of the semiconductor device in the embodiment according to the present invention.
Figure 16B:
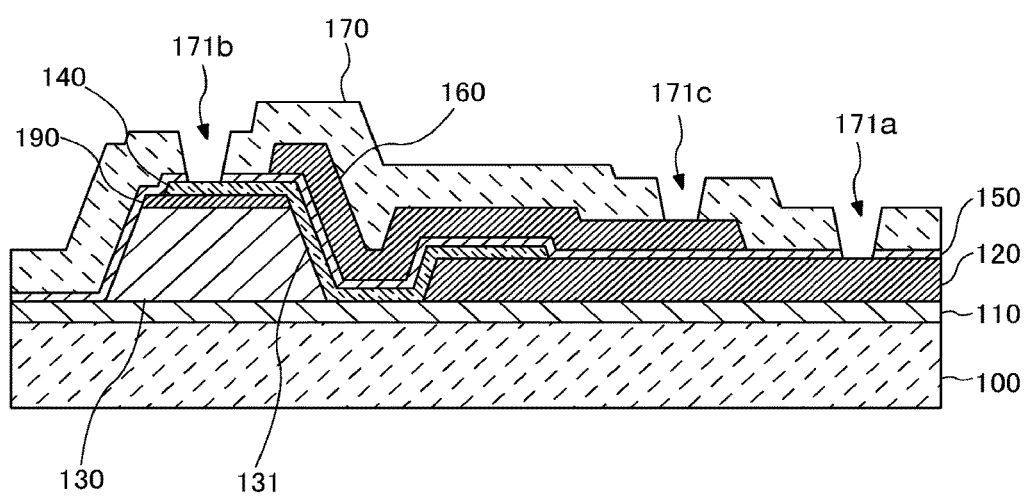
FIG. 16B is a cross-sectional view showing the step of forming the interlayer insulating layer and also forming the openings in the interlayer insulating layer and the gate insulating layer in the manufacturing method of the semiconductor device in the embodiment according to the present invention.

FIG. 16A and FIG. 16B (FIG. 16) are respectively a plan view and a cross-sectional view showing a step of forming the interlayer insulating layer 170 and also forming the openings 171 in the interlayer insulating layer 170 and the gate insulating layer 150 in the manufacturing method of the semiconductor device 20 in embodiment 2 according to the present invention. Referring to FIG. 16B, the interlayer insulating layer 170 is formed on the entirety of the substrate shown in FIG. 15B, and patterning is performed as shown in FIG. 16A by photolithography and etching to form the openings 171. The opening 171a exposes the lower electrode 120, the opening 171b exposes the oxide semiconductor layer 140, and the opening 171c exposes the gate electrode 160.

Figure 17A:
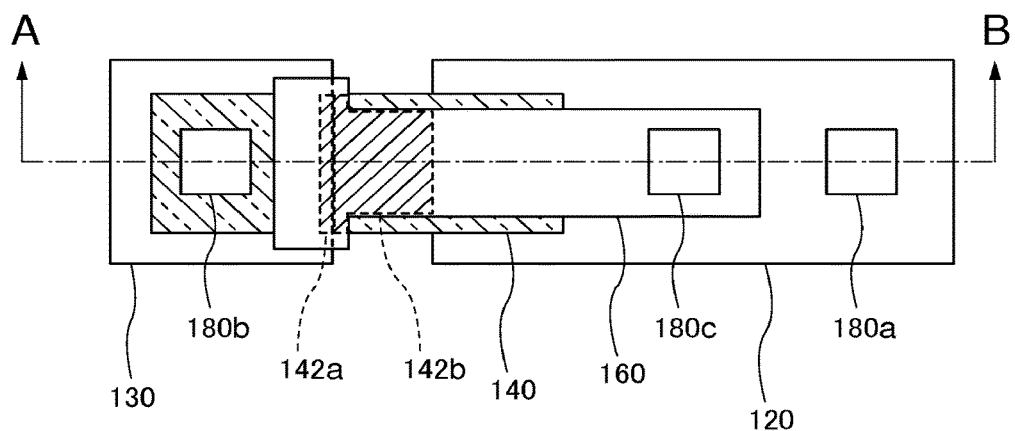
FIG. 17A is a plan view showing a step of forming upper electrodes in the manufacturing method of the semiconductor device in the embodiment according to the present invention.
Figure 17B:
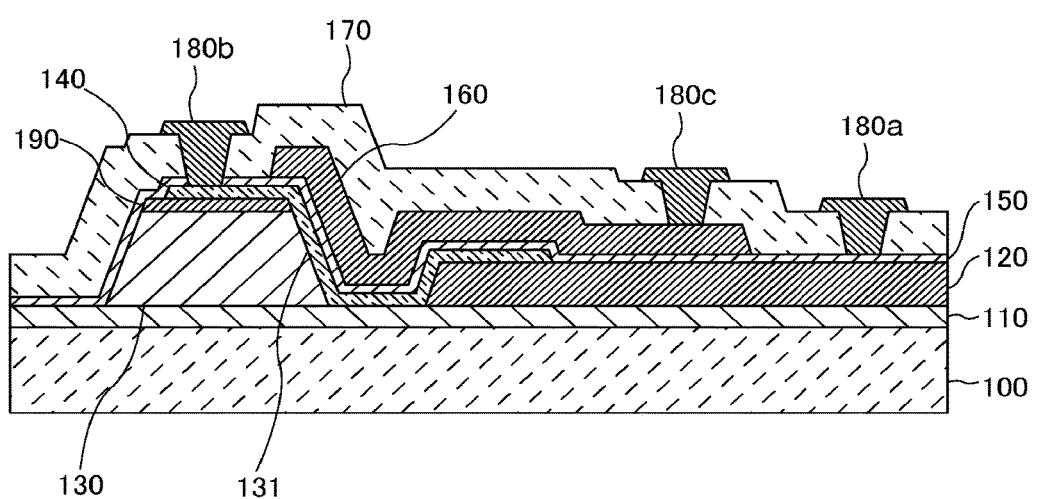
FIG. 17B is a cross-sectional view showing the step of forming the upper electrodes in the manufacturing method of the semiconductor device in the embodiment according to the present invention.

FIG. 17A and FIG. 17B (FIG. 17) are respectively a plan view and a cross-sectional view showing a step of forming the upper electrodes 180 in the manufacturing method of the semiconductor device 20 in embodiment 2 according to the present invention. Referring to FIG. 17B, a film for the upper electrodes 180 is formed on the entirety of the substrate shown in FIG. 16B, and patterning is performed as shown in FIG. 17A by photolithography and etching to form the upper electrodes 180.

The semiconductor device 20 in embodiment 2 according to the present invention is manufactured by the manufacturing method described above. Portions of the oxide semiconductor layer 140 that are located on the underlying layer 110 and the first side wall 131 in FIG. 17B, namely, regions 142a and 142b of the oxide semiconductor layer 140 in FIG. 17A, act as a channel. The materials of the underlying layer 110 and the first insulating layer 130 may be selected such that the regions 142a and 142b of the oxide semiconductor layer 140 have different properties from each other.

<Modification of Embodiment 2>

Figure 18:
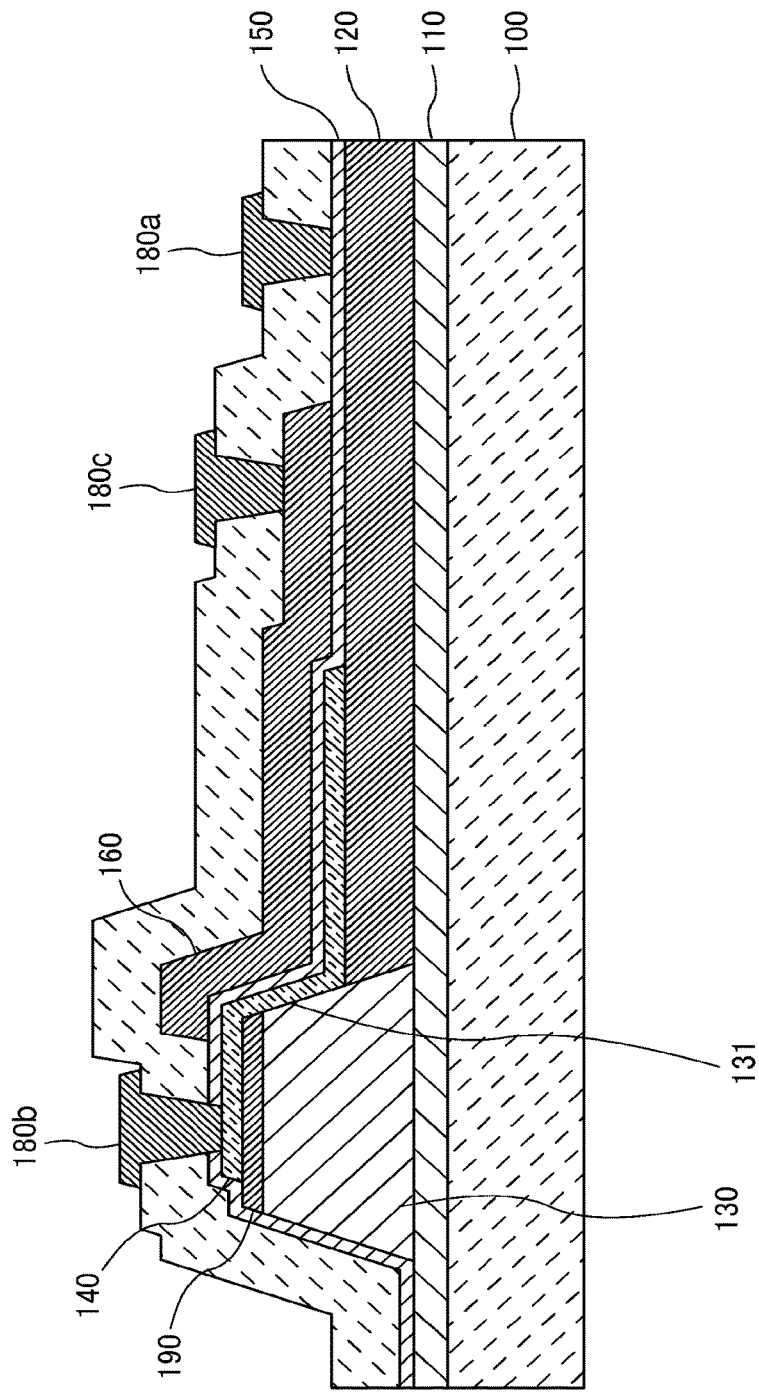
FIG. 18 is a cross-sectional view showing an overview of a semiconductor device in an embodiment according to the present invention.

With reference to FIG. 18, a modification of embodiment 2 according to the present invention will be described. A semiconductor device 21 in the modification of embodiment 2 is similar to the semiconductor device 20 in embodiment 2. In the following description, the identical elements to, or the elements having the identical functions to, those of the semiconductor device 20 will bear the identical reference numerals thereto, and detailed descriptions thereof will be omitted.

FIG. 18 is a cross-sectional view showing an overview of the semiconductor device 21 in the modification of embodiment 2 according to the present invention. As shown in FIG. 18, the semiconductor device 21 is similar to the semiconductor device 20 shown in FIG. 11. However, in the semiconductor device 21, unlike in the semiconductor device 20 shown in FIG. 11, the lower electrode 120 is located on a part of the first side wall 131 of the first insulating layer 130. In the semiconductor device 21, an end of the lower electrode 120 and an end of the first insulating layer 130 (i.e., end of the first side wall 131) generally match each other. Namely, the lower electrode 120 is located so as not to be higher than the current height on the first side wall 131. The lower electrode 120 is not limited to having the structure shown in FIG. 18, and may be higher than the current height on the first side wall 131 as long as the lower electrode 120 does not each the first assisting electrode 190.

As described above, in the semiconductor device 21 in the modification of embodiment 2, a distance of a portion of the first side wall 131 that is between the end of the lower electrode 120 and the end of the first assisting electrode 190 is the channel length. Namely, the channel length may be adjusted by the thickness of the first insulating layer 130 and the thickness of the lower electrode 120.

Embodiment 3

Figure 19A:
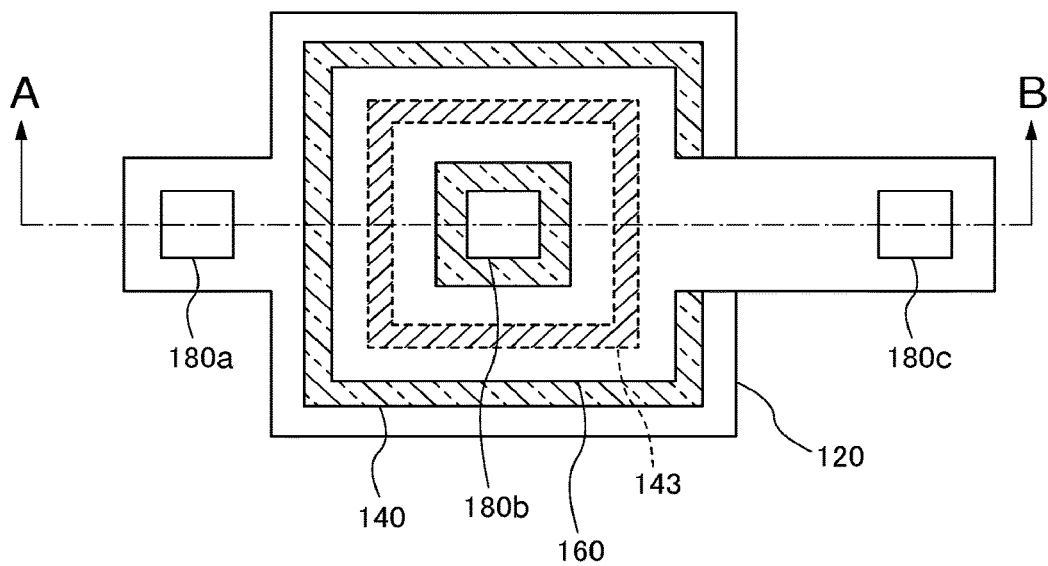
FIG. 19A is a plan view showing an overview of a semiconductor device in an embodiment according to the present invention.
Figure 19B:
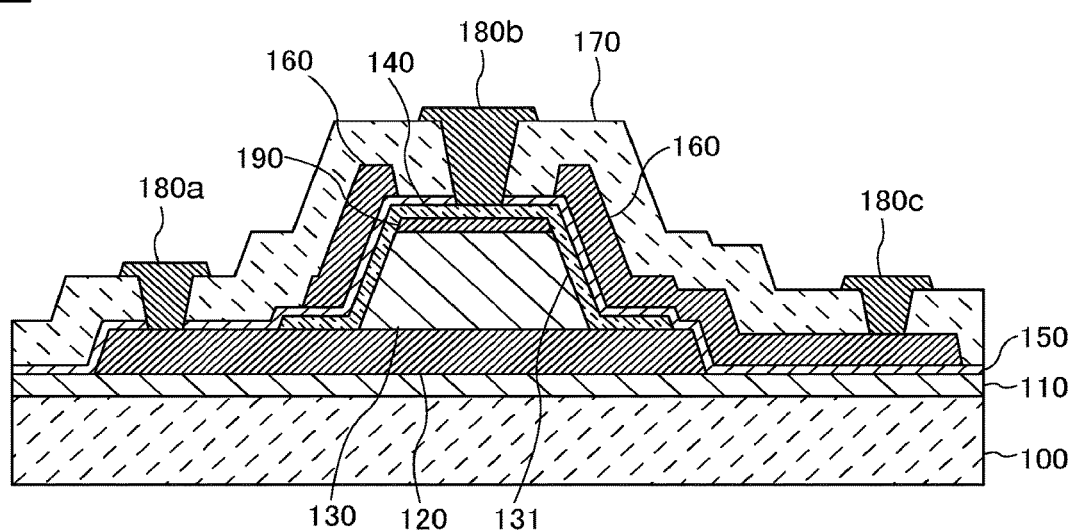
FIG. 19B is a cross-sectional view showing an overview of the semiconductor device in the embodiment according to the present invention.

With reference to FIG. 19A and FIG. 19B (FIG. 19), an overview of a semiconductor device 30 in embodiment 3 according to the present invention will be described. The semiconductor device 30 in embodiment 3 is usable in a display device or a driving circuit, like the semiconductor layer 10 in embodiment 1. The semiconductor device 30 in embodiment 3 is described as having a structure including a channel formed of an oxide semiconductor. The semiconductor device 30 in embodiment 3 is not limited to having such a structure, and may include a channel formed of, for example, a semiconductor such as silicon or the like, a compound semiconductor such as Ga—As or the like, or an organic semiconductor such as pentacene, tetracyanoquinodimethane (TCNQ) or the like. In embodiment 3, the semiconductor device 30 is a transistor. This does not limit the semiconductor device according to the present invention to a transistor.

[Structure of the Semiconductor Device 30]

FIG. 19A is a plan view showing an overview of the semiconductor device 30 in embodiment 3 according to the present invention. FIG. 19B is a cross-sectional view showing an overview of the semiconductor device 30 in embodiment 3 according to the present invention. The semiconductor device 30 shown in FIG. 19 has the same cross-sectional structure as that of the semiconductor device 10 shown in FIG. 7, but have a layout different from that of the semiconductor device 10. Specifically, in the semiconductor device 30, unlike in the semiconductor device 10, the oxide semiconductor layer 140 is located so as to cover the first insulating layer 130 (see FIG. 20A) and the gate electrode 160 is located in a ring shape around the upper electrode 180b so as to cover the first side wall 131 (see FIG. 21A) as seen in a plan view. Namely, as shown in FIG. 19A, a channel region 143 of the semiconductor device 30 is formed to have a ring shape, and an end of the oxide semiconductor layer 140 is not included in the channel region 143. Since the channel region 143 has a ring shape, this structure is called the "surround type".

In the example shown in FIG. 19B, the oxide semiconductor layer 140 is formed to cover the first side wall 131 and a top surface of the first insulating layer 130. The oxide semiconductor layer 140 is not limited to having such a structure. For example, it is sufficient that the oxide semiconductor layer 140 is formed on at least the first side wall 131. Namely, the oxide semiconductor layer 140 does not need to cover the top surface of the first insulating layer 130.

In the example shown in FIG. 19, the surround-type semiconductor device 30 has the structure of embodiment 1 shown in FIG. 1. Alternatively, a surround-type semiconductor device may have the structure of any of modifications 1 through 3 of embodiment 1 shown in FIG. 8 through FIG. 10. Still alternatively, a surround-type semiconductor device may have the structure of embodiment 2 shown in FIG. 11 or the modification of embodiment 2 shown in FIG. 18.

As described above, in the semiconductor device 30 in embodiment 3 according to the present invention, the gate electrode 160 is located in a ring shape while facing the first side wall 131, and the channel region 143 is located in a ring shape. Therefore, the end of the oxide semiconductor layer 140 is not included in the channel region 143. Because of this structure, no leak path is generated by the end of the oxide semiconductor layer 140. Namely, the semiconductor device 30 is capable of further decreasing the off-current in addition to providing the effect of embodiment 1.

[Manufacturing Method of the Semiconductor Device 30]

With reference to plan views and cross-sectional views provided in FIG. 20 through FIG. 22, a manufacturing method of the semiconductor device 30 in embodiment 3 according to the present invention will be described. The manufacturing method of the semiconductor device 30 shown in FIG. 19 is similar to the manufacturing method of the semiconductor device 10 shown in FIG. 1, and thus will not be described in detail. The manufacturing method of the semiconductor device 30 is the same as that of the manufacturing method of the semiconductor device 10 up to the step of forming the first insulating layer 130 and the first assisting electrode (same as in FIG. 2 and FIG. 3). This part of the manufacturing method will not be described.

Figure 20A:
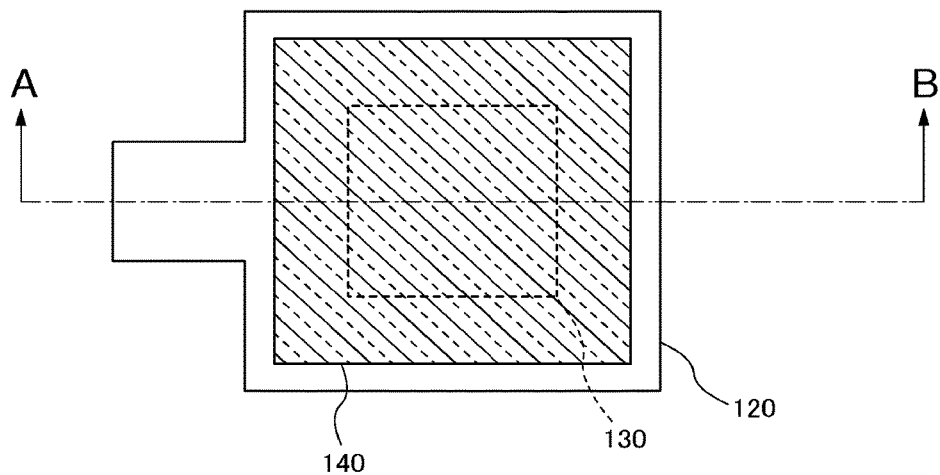
FIG. 20A is a plan view showing a step of forming an oxide semiconductor layer in a manufacturing method of the semiconductor device in the embodiment according to the present invention.
Figure 20B:
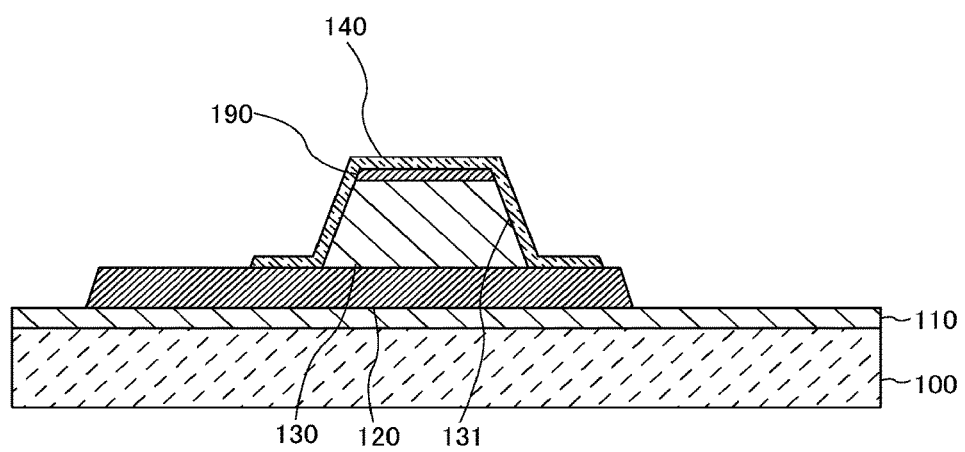
FIG. 20B is a cross-sectional view showing the step of forming the oxide semiconductor layer in the manufacturing method of the semiconductor device in the embodiment according to the present invention.

FIG. 20A and FIG. 20B (FIG. 20) are respectively a plan view and a cross-sectional view showing a step of forming the oxide semiconductor layer 140 in the manufacturing method of the semiconductor device 30 in embodiment 3 according to the present invention. Referring to FIG. 20B, a film for the oxide semiconductor layer 140 is formed on the entirety of the substrate shown in FIG. 3B, and patterning is performed as shown in FIG. 20A to form the oxide semiconductor layer 140. In the example shown in FIG. 20, the oxide semiconductor layer 140 is formed so as to cover the first insulating layer 130. It is sufficient that the oxide semiconductor layer 140 is located in a ring shape around the first side wall 131, which is ring-shaped, and is partially connected with the lower electrode 120 and the first assisting electrode 190. Namely, the oxide semiconductor layer 140 does not need to cover a top surface of the first assisting electrode 190.

Figure 21A:
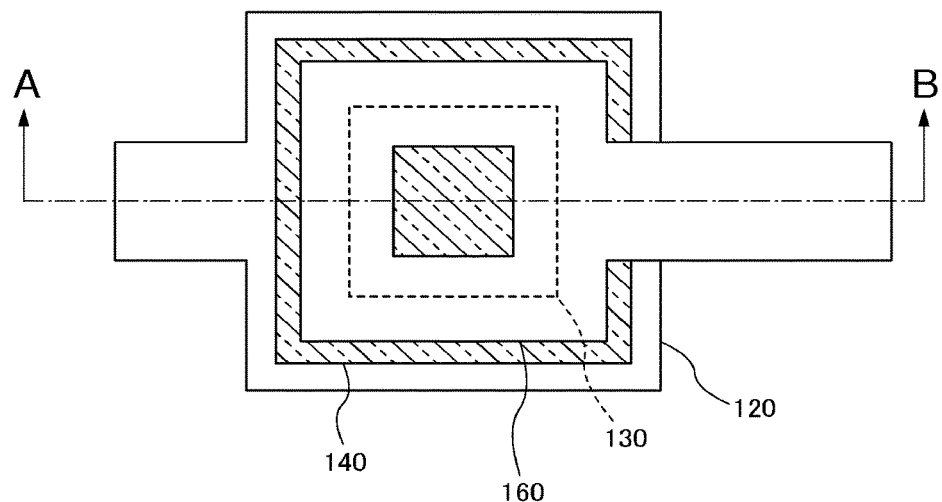
FIG. 21A is a plan view showing a step of forming a gate insulating layer and a gate electrode in the manufacturing method of the semiconductor device in the embodiment according to the present invention.
Figure 21B:
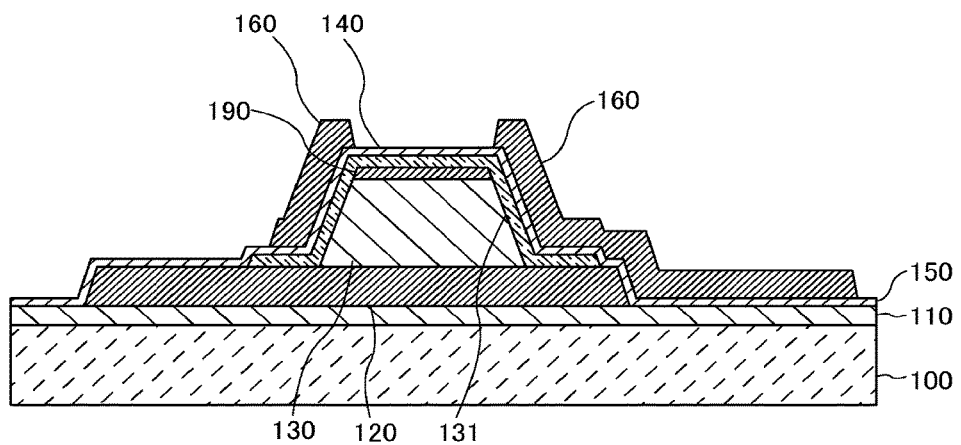
FIG. 21B is a cross-sectional view showing the step of forming the gate insulating layer and the gate electrode in the manufacturing method of the semiconductor device in the embodiment according to the present invention.

FIG. 21A and FIG. 21B (FIG. 21) are respectively a plan view and a cross-sectional view showing a step of forming the gate insulating layer 150 and the gate electrode 160 in the manufacturing method of the semiconductor device 30 in embodiment 3 according to the present invention. Referring to FIG. 21B, the gate insulating layer 150 and a film for the gate electrode 160 are formed on the entirety of the substrate shown in FIG. 20B, and patterning is performed as shown in FIG. 21A to form the gate electrode 160.

Figure 22A:
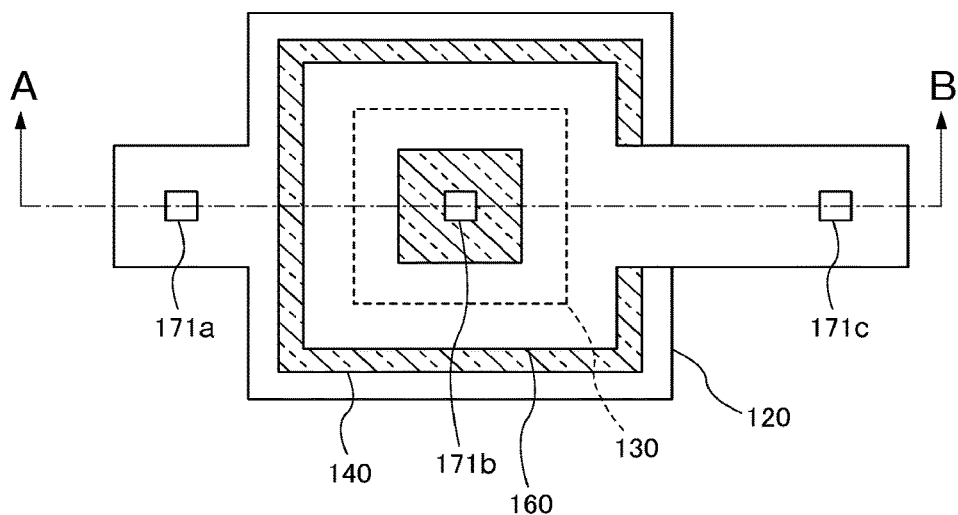
FIG. 22A is a plan view showing a step of forming an interlayer insulating layer and also forming openings in the interlayer insulating layer and the gate insulating layer in the manufacturing method of the semiconductor device in the embodiment according to the present invention.
Figure 22B:
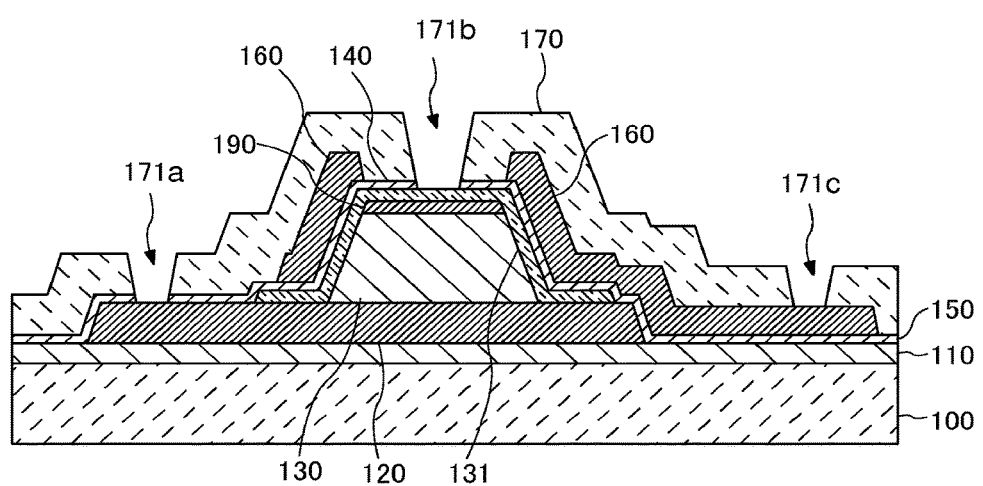
FIG. 22B is a cross-sectional view showing the step of forming the interlayer insulating layer and also forming the openings in the interlayer insulating layer and the gate insulating layer in the manufacturing method of the semiconductor device in the embodiment according to the present invention.

FIG. 22A and FIG. 22B (FIG. 22) are respectively a plan view and a cross-sectional view showing a step of forming the interlayer insulating layer 170 and also forming the openings 171 in the interlayer insulating layer 170 and the gate insulating layer 150 in the manufacturing method of the semiconductor device 30 in embodiment 3 according to the present invention. Referring to FIG. 22B, the interlayer insulating layer 170 is formed on the entirety of the substrate shown in FIG. 21B, and patterning is performed as shown in FIG. 22A to form the openings 171. The opening 171a exposes the lower electrode 120, the opening 171b exposes the oxide semiconductor layer 140, and the opening 171c exposes the gate electrode 160. Then, a film for the upper electrodes 180 is formed on the entirety of the substrate shown in FIG. 22B, and patterning is performed to form the upper electrodes 180 as shown in FIG. 19. In this manner, the semiconductor device 30 shown in FIG. 19 is manufactured.

<Modifications of Embodiment 3>

With reference to FIG. 23 through FIG. 32, modifications of embodiment 3 according to the present invention will be described. Semiconductor devices 31 and 32 in modifications 1 and 2 of embodiment 3 each have the same cross-sectional structure as that of the semiconductor device 10 shown in FIG. 7, but have a layout different from that of the semiconductor device 10. Hereinafter, the layouts in each modification will be described in detail.

[Structure of the Semiconductor Device 31]

Figure 23A:
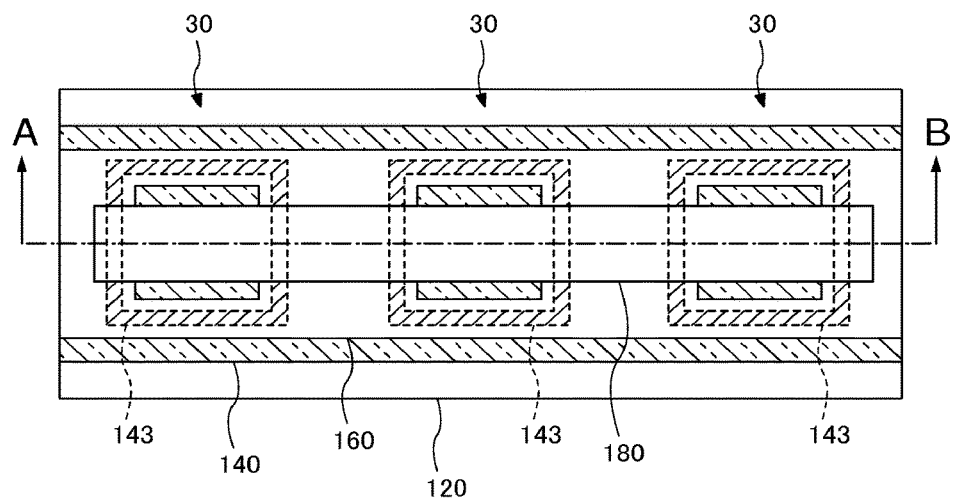
FIG. 23A is a plan view showing an overview of a semiconductor device in an embodiment according to the present invention.
Figure 23B:
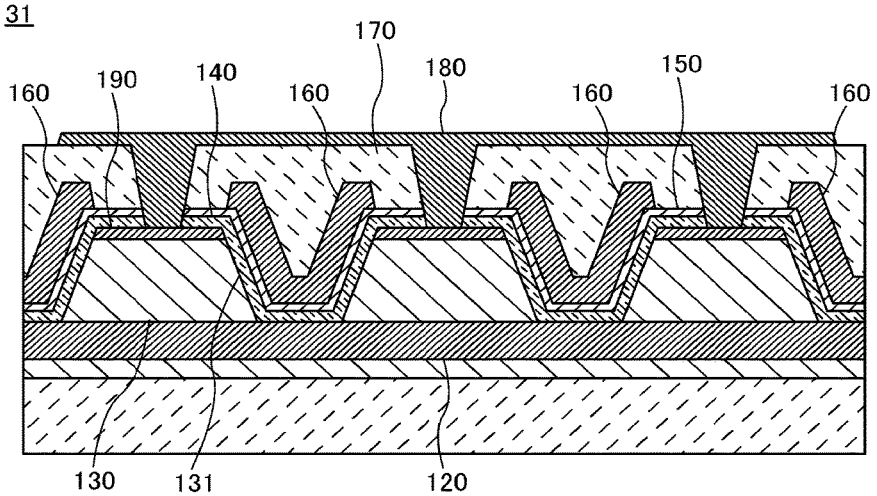
FIG. 23B is a cross-sectional view showing an overview of the semiconductor device in the embodiment according to the present invention.

FIG. 23A and FIG. 23B (FIG. 23) are respectively a plan view and a cross-sectional view showing an overview of the semiconductor device 31 in modification 1 of embodiment 3 according to the present invention. As shown in FIG. 23, the semiconductor device 31 in modification 1 of embodiment 3 includes a plurality of the surround-type semiconductor devices 30 shown in FIG. 19 that are coupled to each other in series. Namely, the semiconductor devices 30 each including the ring-shaped channel region 143 are located adjacent to each other. The first electrodes 120 of the plurality of the semiconductor devices 30 are provided as one integral first electrode 120, the gate electrodes 160 of the plurality of the semiconductor devices 30 are provided as one integral gate electrode 160, and the upper electrodes 180 of the plurality of the semiconductor devices 30 are provided as one integral gate electrode 180. Therefore, the plurality of semiconductor devices 30 are supplied with the same source-drain voltage at the same time and with the same gate voltage at the same time.

In the example shown in FIG. 23, the surround-type semiconductor devices 30 each have the structure of embodiment 1 shown in FIG. 1. Alternatively, surround-type semiconductor devices may each have the structure of any of modifications 1 through 3 of embodiment 1 shown in FIG. 8 through FIG. 10. Still alternatively, surround-type semiconductor devices may each have the structure of embodiment 2 shown in FIG. 11 or the modification of embodiment 2 shown in FIG. 18.

As described above, in the semiconductor device 31, the ring-shaped channel regions 143 of the plurality of semiconductor devices 30 are turned on/off at the same time. Therefore, the W length of the semiconductor device 31 is substantially increased. As a result, the semiconductor device 31 is capable of increasing the on-current.

[Manufacturing Method of the Semiconductor Device 31]

In order to more clarify the structure of the semiconductor device 31 shown in FIG. 23, a manufacturing method of the semiconductor device 31 will be described with reference to plan views and cross-sectional views provided in FIG. 24 through FIG. 27. Each of the semiconductor devices 30 included in the semiconductor device 31 shown in FIG. 23 are the same as the semiconductor device 30 shown in FIG. 19, and thus will not be described in detail.

Figure 24A:
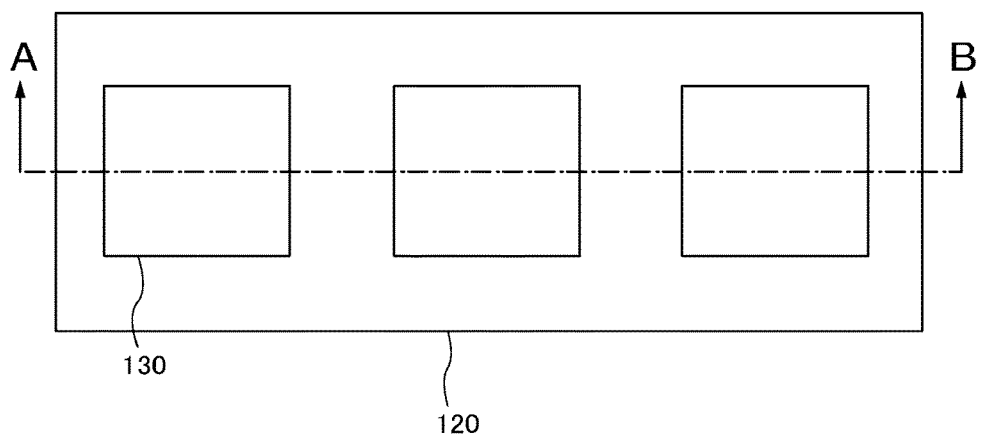
FIG. 24A is a plan view showing a step of forming a first insulating layer and a first assisting electrode on a lower electrode in a manufacturing method of the semiconductor device in the embodiment according to the present invention.
Figure 24B:
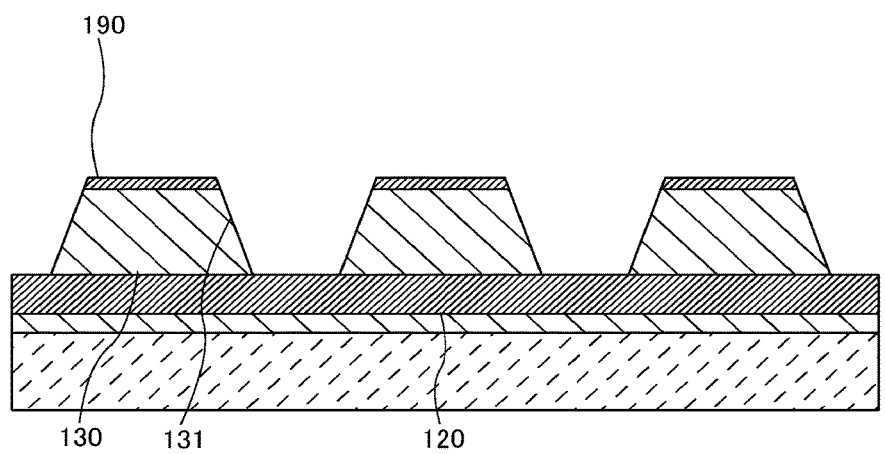
FIG. 24B is a cross-sectional view showing the step of forming the first insulating layer and the first assisting electrode on the lower electrode in the manufacturing method of the semiconductor device in the embodiment according to the present invention.

FIG. 24A and FIG. 24B (FIG. 24) are respectively a plan view and a cross-sectional view showing a step of forming the first insulating layers 130 and the first assisting electrodes 190 on the lower electrode 120 in the manufacturing method of the semiconductor device 31 in modification 1 of embodiment 3 according to the present invention. As shown in FIG. 24, a plurality of the first insulating layers 130 and a plurality of the first assisting electrodes 190 are formed adjacent to each other on one lower electrode 120. In the example shown in FIG. 24, three first insulating layers 130 and three first assisting electrode 190 are formed on one lower electrode 120. The semiconductor device 31 is not limited to having such a structure, and the number of the first insulating layers 130 and the number of the first assisting electrode 190 located on one lower electrode 120 may be smaller or larger than three.

Figure 25A:
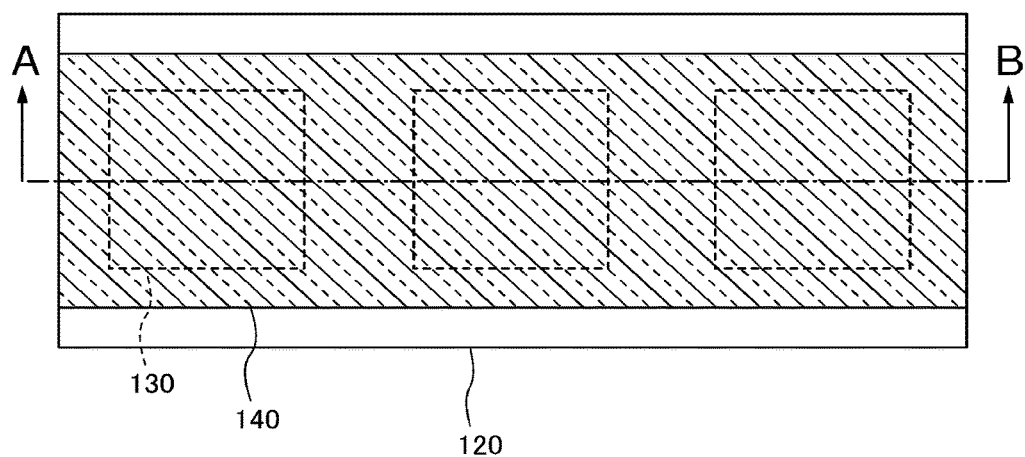
FIG. 25A is a plan view showing a step of forming an oxide semiconductor layer in the manufacturing method of the semiconductor device in the embodiment according to the present invention.
Figure 25B:
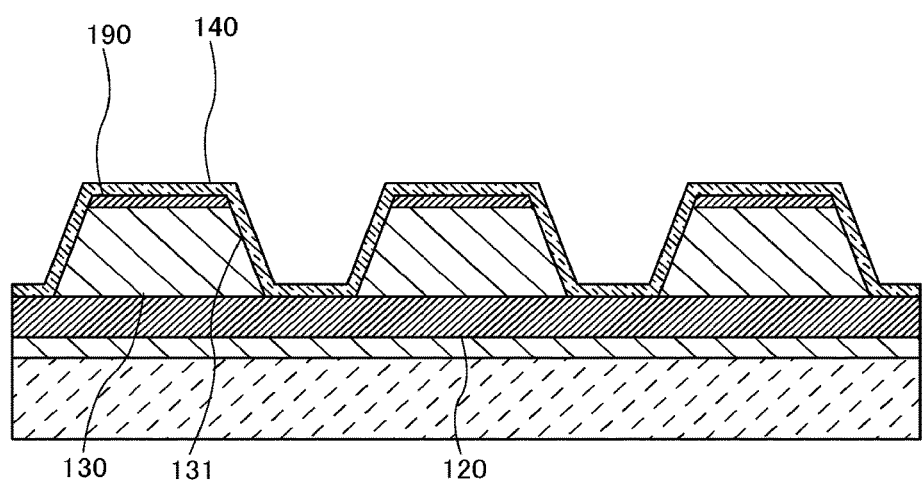
FIG. 25B is a cross-sectional view showing the step of forming the oxide semiconductor layer in the manufacturing method of the semiconductor device in the embodiment according to the present invention.

FIG. 25A and FIG. 25B (FIG. 25) are respectively a plan view and a cross-sectional view showing a step of forming the oxide semiconductor layer 140 in the manufacturing method of the semiconductor device 31 in modification 1 of embodiment 3 according to the present invention. Referring to FIG. 25B, a film for the oxide semiconductor layer 140 is formed on the entirety of the substrate shown in FIG. 24B, and patterning is performed as shown in FIG. 25A to form the oxide semiconductor layer 140. In the example shown in FIG. 25, the oxide semiconductor layer 140 covers the first insulating layers 130. It is sufficient that the oxide semiconductor layer 140 is located in a ring shape around the first side walls 131, which are ring-shaped, and is partially connected with the lower electrode 120 and the first assisting electrodes 190. Namely, the oxide semiconductor layer 140 does not need to cover the top surfaces of the first assisting electrodes 190.

Figure 26A:
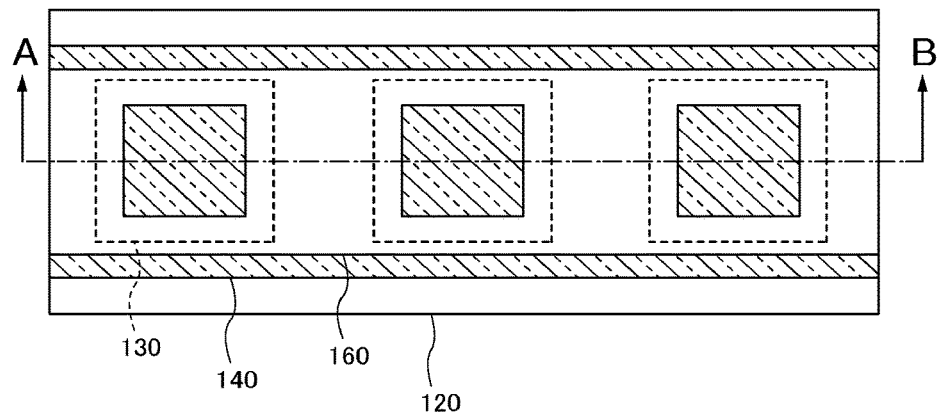
FIG. 26A is a plan view showing a step of forming a gate insulating layer and a gate electrode in the manufacturing method of the semiconductor device in the embodiment according to the present invention.
Figure 26B:
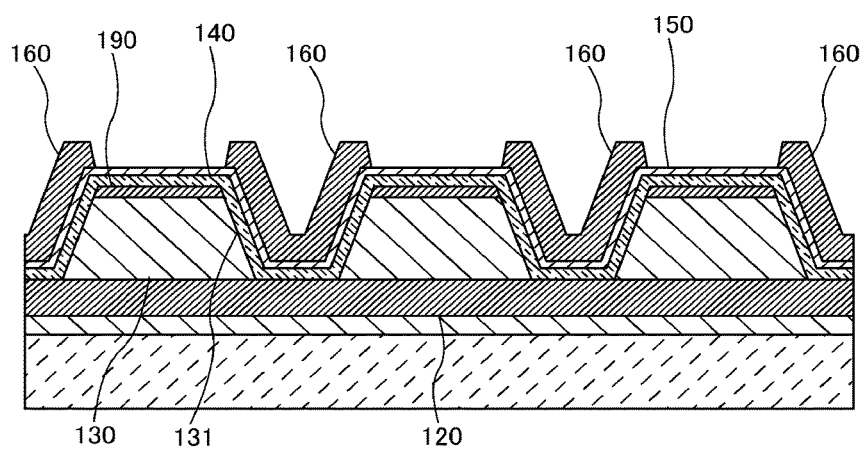
FIG. 26B is a cross-sectional view showing the step of forming the gate insulating layer and the gate electrode in the manufacturing method of the semiconductor device in the embodiment according to the present invention.

FIG. 26A and FIG. 26B (FIG. 26) are respectively a plan view and a cross-sectional view showing a step of forming the gate insulating layer 150 and the gate electrode 160 in the manufacturing method of the semiconductor device 31 in modification 1 of embodiment 3 according to the present invention. Referring to FIG. 26B, the gate insulating layer 150 and a film for the gate electrode 160 are formed on the entirety of the substrate shown in FIG. 25B, and patterning is performed as shown in FIG. 26A to form the gate electrode 160.

Figure 27A:
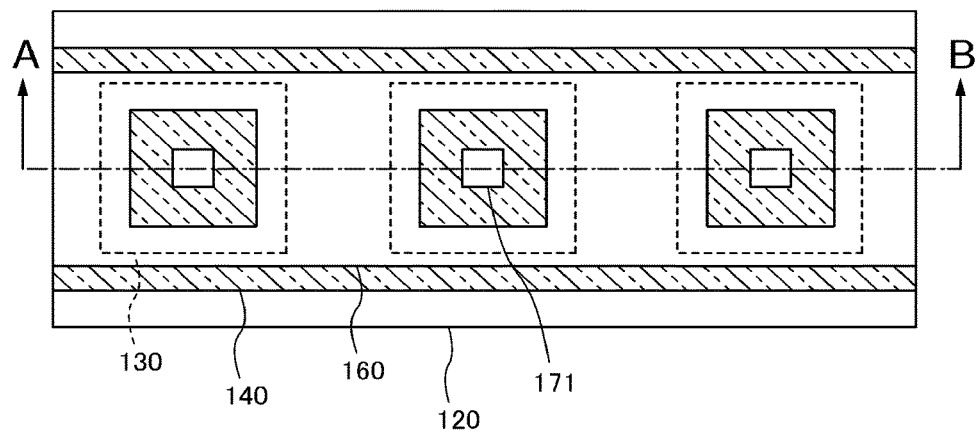
FIG. 27A is a plan view showing a step of forming an interlayer insulating layer and also forming openings in the interlayer insulating layer and the gate insulating layer in the manufacturing method of the semiconductor device in the embodiment according to the present invention.
Figure 27B:
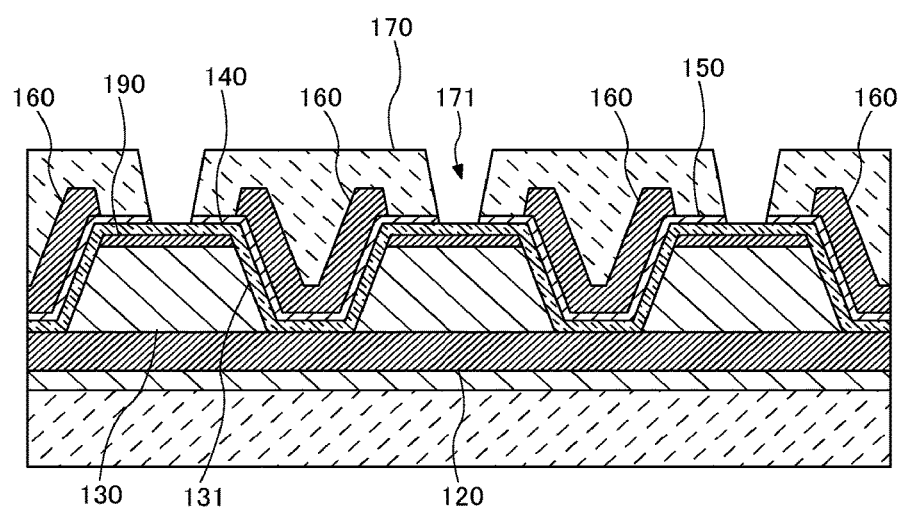
FIG. 27B is a cross-sectional view showing the step of forming the interlayer insulating layer and also forming the openings in the interlayer insulating layer and the gate insulating layer in the manufacturing method of the semiconductor device in the embodiment according to the present invention.

FIG. 27A and FIG. 27B (FIG. 27) are respectively a plan view and a cross-sectional view showing a step of forming the interlayer insulating layer 170 and also forming the openings 171 in the interlayer insulating layer 170 and the gate insulating layer 150 in the manufacturing method of the semiconductor device 31 in modification 1 of embodiment 3 according to the present invention. Referring to FIG. 27B, the interlayer insulating layer 170 is formed on the entirety of the substrate shown in FIG. 26B, and patterning is performed as shown in FIG. 27A to form the openings 171. The openings 171 respectively expose portions of the oxide semiconductor layer 140 that are located on the plurality of first insulating layers 130. Then, a film for the upper electrode 180 is formed on the entirety of the substrate shown in FIG. 27B, and patterning is performed to form the upper electrode 180 as shown in FIG. 23. In this manner, the semiconductor device 31 shown in FIG. 23 is manufactured.

[Structure of the Semiconductor Device 32]

Figure 28A:
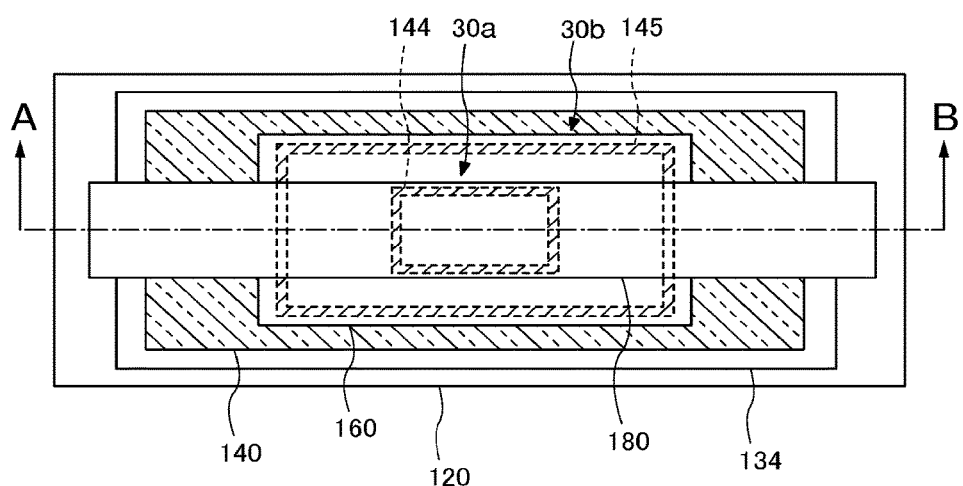
FIG. 28A is a plan view showing an overview of a semiconductor device in an embodiment according to the present invention.
Figure 28B:
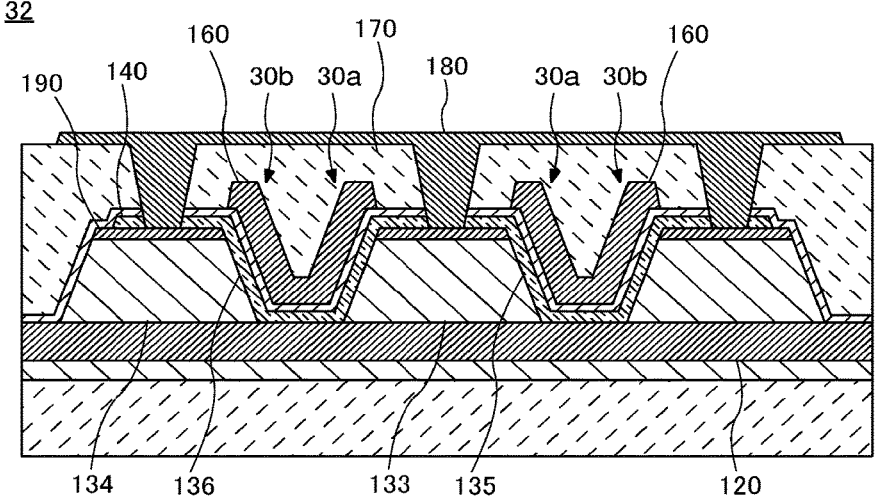
FIG. 28B is a cross-sectional view showing an overview of the semiconductor device in the embodiment according to the present invention.

FIG. 28A and FIG. 28B (FIG. 28) are respectively a plan view and a cross-sectional view showing an overview of the semiconductor device 32 in modification 2 of embodiment 3 according to the present invention. As shown in FIG. 28, the semiconductor device 32 in modification 2 of embodiment 3 includes a plurality of the surround-type semiconductor devices 30 shown in FIG. 19 that are coupled parallel to each other, such that the ring-shaped channel regions are multiplexed. Namely, a semiconductor device 30b including a second ring-shaped channel region 145, which is an outer channel region, is located so as to surround a semiconductor device 30a including a first ring-shaped channel region 144, which is an inner channel region.

Figure 29A:
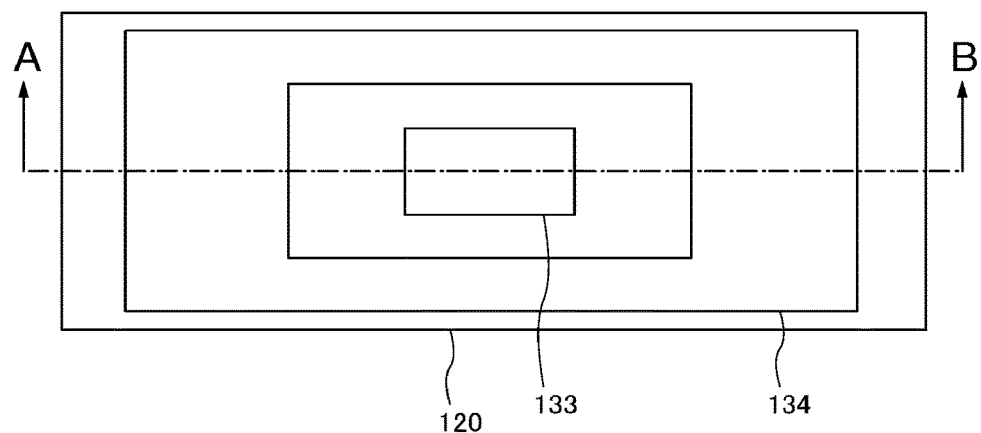
FIG. 29A is a plan view showing a step of forming a first insulating layer, a second insulating layer, a first assisting electrode and a second assisting electrode on a lower electrode in a manufacturing method of the semiconductor device in the embodiment according to the present invention.
Figure 29B:
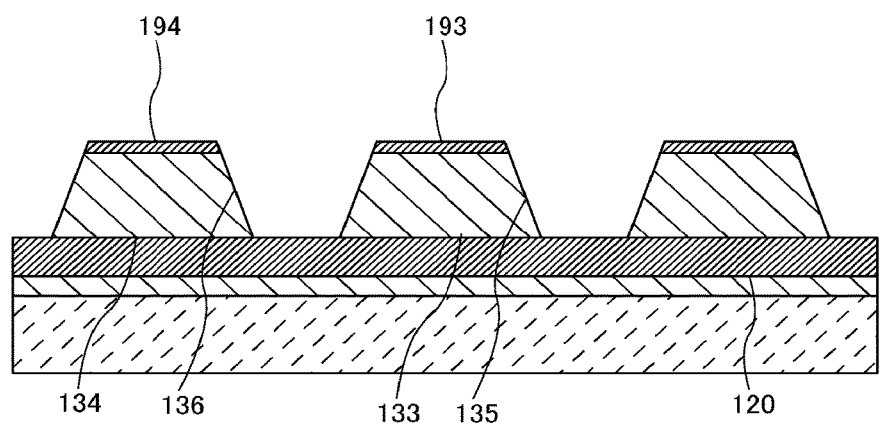
FIG. 29B is a cross-sectional view showing the step of forming the first insulating layer, the second insulating layer, the first assisting electrode and the second assisting electrode on the lower electrode in the manufacturing method of the semiconductor device in the embodiment according to the present invention.

As shown also in FIG. 29A and FIG. 29B (FIG. 29), the semiconductor device 32 includes a first insulating layer 133 having a first side wall 135 and a second insulating layer 134 having a second side wall 136. The second insulating layer 134 is located around the first insulating layer 133. The first side wall 135 and the second side wall 136 face each other as seen in a plan view. The first electrodes 120 of the semiconductor devices 30a and 30b are provided as one integral first electrode 120, the gate electrodes 160 of the semiconductor devices 30a and 30b are provided as one integral gate electrode 160, and the upper electrodes 180 of the semiconductor devices 30a and 30b are provided as one integral upper electrode 180. Namely, one integral electrode 160 is provided on the first side wall 135 and the second side wall 136. Therefore, the semiconductor devices 30a and 30b are supplied with the same source-drain voltage at the same time and with the same gate voltage at the same time.

In the example shown in FIG. 28, the surround-type semiconductor devices 30a and 30b each have the structure of embodiment 1 shown in FIG. 1. Alternatively, surround-type semiconductor devices may each have the structure of any of modifications 1 through 3 of embodiment 1 shown in FIG. 8 through FIG. 10. Still alternatively, surround-type semiconductor devices may each have the structure of embodiment 2 shown in FIG. 11 or the modification of embodiment 2 shown in FIG. 18.

As described above, in the semiconductor device 32, the ring-shaped channel region 144 of the semiconductor device 30a and the ring-shaped channel region 145 of the semiconductor device 30b are turned on/off at the same time. Therefore, the W length of the semiconductor device 32 is substantially increased. As a result, the semiconductor device 32 is capable of increasing the on-current.

[Manufacturing Method of the Semiconductor Device 32]

In order to more clarify the structure of the semiconductor device 32 shown in FIG. 28, a manufacturing method of the semiconductor device 32 will be described with reference to plan views and cross-sectional views provided in FIG. 29 through FIG. 32. The cross-sectional structure of each of the semiconductor devices 30a and 30b included in the semiconductor device 32 shown in FIG. 28 is the same as that of the semiconductor device 30 shown in FIG. 19, and thus will not be described in detail.

FIG. 29A and FIG. 29B (FIG. 29) are respectively a plan view and a cross-sectional view showing a step of forming the first insulating layer 133, the second insulating layer 134, a first assisting electrode 193 and a second assisting electrode 194 on the lower electrode 120 in the manufacturing method of the semiconductor device 32 in modification 2 of embodiment 3 according to the present invention. As shown in FIG. 29, the first insulating layer 133 and the first assisting electrode 193, and also the second insulating layer 134 and the second assisting electrode 194, which are ring-shaped, are formed on one lower electrode 120. The second insulating layer 134 and the second assisting electrode 194 are located around the first insulating layer 133 and the first assisting electrode 193. In the semiconductor device 32, a channel is formed between the first side wall 135 of the first insulating layer 133 and the second side wall 136 of the second insulating layer 134.

Figure 30A:
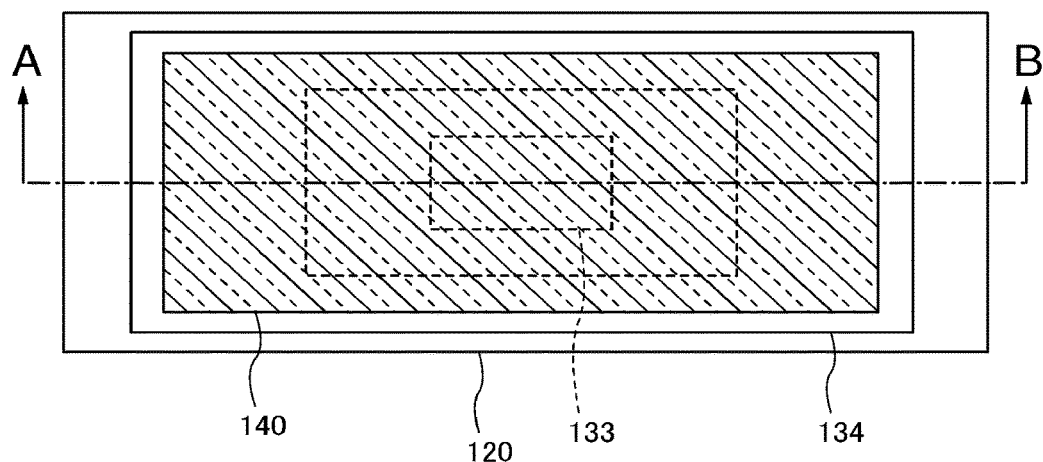
FIG. 30A is a plan view showing a step of forming an oxide semiconductor layer in the manufacturing method of the semiconductor device in the embodiment according to the present invention.
Figure 30B:
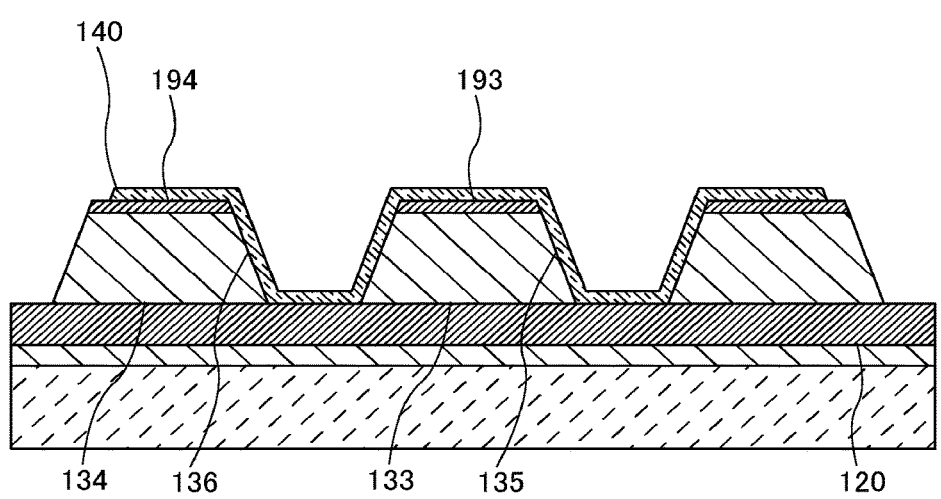
FIG. 30B is a cross-sectional view showing the step of forming the oxide semiconductor layer in the manufacturing method of the semiconductor device in the embodiment according to the present invention.

FIG. 30A and FIG. 30B (FIG. 30) are respectively a plan view and a cross-sectional view showing a step of forming the oxide semiconductor layer 140 in the manufacturing method of the semiconductor device 32 in modification 2 of embodiment 3 according to the present invention. Referring to FIG. 30B, a film for the oxide semiconductor layer 140 is formed on the entirety of the substrate shown in FIG. 29B, and patterning is performed as shown in FIG. 30A to form the oxide semiconductor layer 140. In the example shown in FIG. 30, the oxide semiconductor layer 140 covers the first insulating layer 133, and has an outer perimeter that is located outer to an inner perimeter of the second insulating layer 134 and inner to the outer perimeter of the second insulating layer 134. It is sufficient that the oxide semiconductor layer 140 is located in a ring shape along the first side wall 135 and the second side wall 136 and is at least partially connected with the lower electrode 120, the first assisting electrode 193 and the second assisting electrode 194.

Figure 31A:
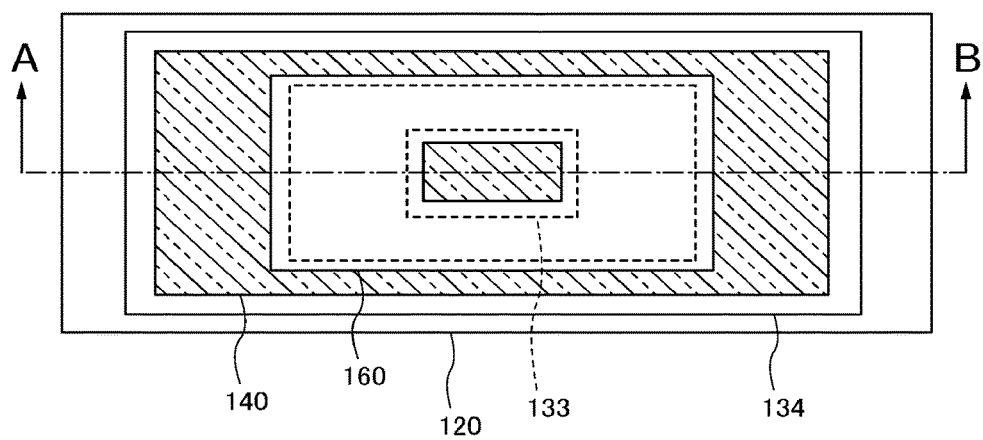
FIG. 31A is a plan view showing a step of forming a gate insulating layer and a gate electrode in the manufacturing method of the semiconductor device in the embodiment according to the present invention.
Figure 31B:
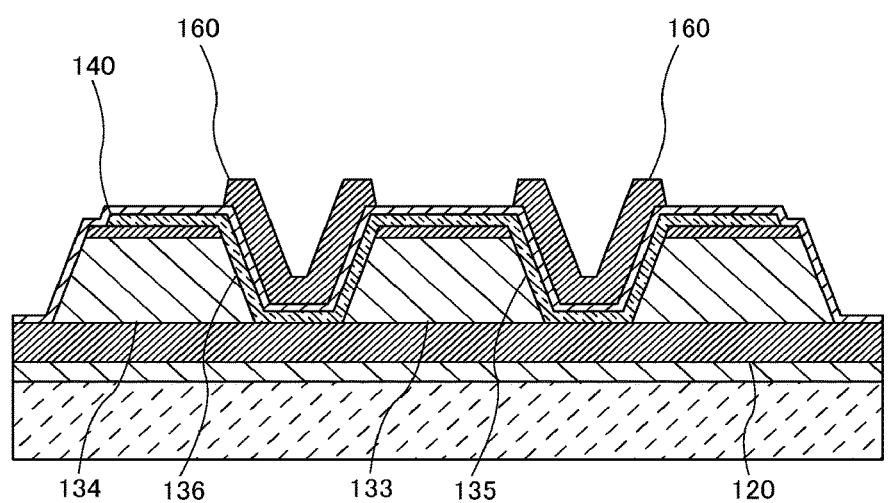
FIG. 31B is a cross-sectional view showing the step of forming the gate insulating layer and the gate electrode in the manufacturing method of the semiconductor device in the embodiment according to the present invention.

FIG. 31A and FIG. 31B (FIG. 31) are respectively a plan view and a cross-sectional view showing a step of forming the gate insulating layer 150 and the gate electrode 160 in the manufacturing method of the semiconductor device 32 in modification 2 of embodiment 3 according to the present invention. Referring to FIG. 31B, the gate insulating layer 150 and a film for the gate electrode 160 are formed on the entirety of the substrate shown in FIG. 30B, and patterning is performed as shown in FIG. 31A to form the gate electrode 160.

Figure 32A:
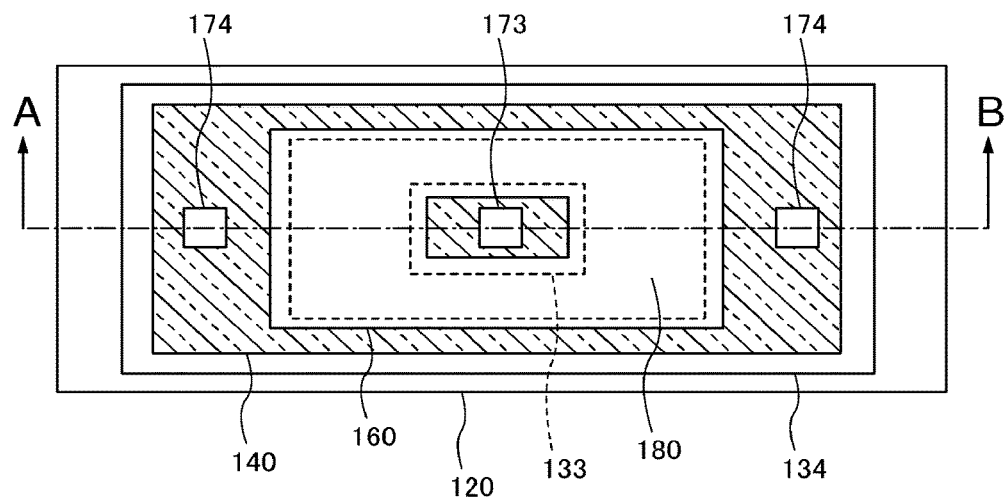
FIG. 32A is a plan view showing a step of forming an interlayer insulating layer and also forming openings in the interlayer insulating layer and the gate insulating layer in the manufacturing method of the semiconductor device in the embodiment according to the present invention.
Figure 32B:
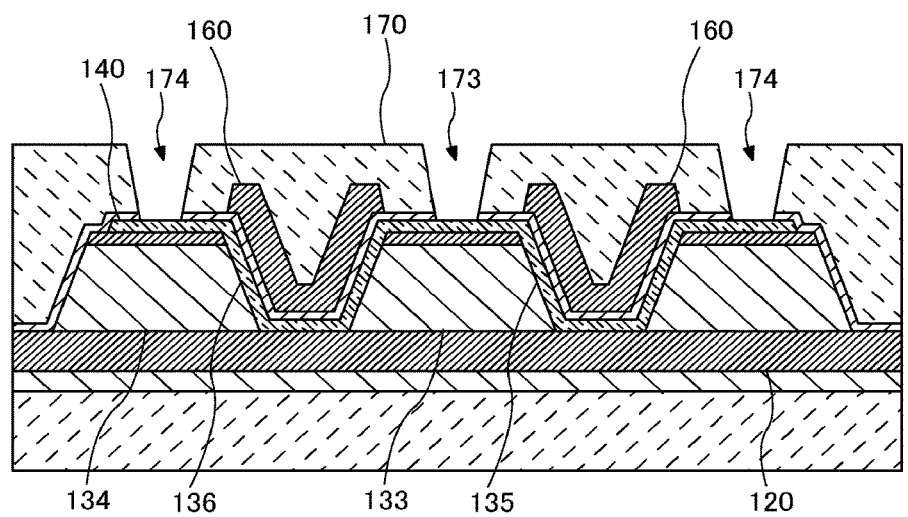
FIG. 32B is a cross-sectional view showing the step of forming the interlayer insulating layer and also forming the openings in the interlayer insulating layer and the gate insulating layer in the manufacturing method of the semiconductor device in the embodiment according to the present invention.

FIG. 32A and FIG. 32B (FIG. 32) are respectively a plan view and a cross-sectional view showing a step of forming the interlayer insulating layer 170 and also forming openings 173 and 174 in the interlayer insulating layer 170 and the gate insulating layer 150 in the manufacturing method of the semiconductor device 32 in modification 2 of embodiment 3 according to the present invention. Referring to FIG. 32B, the interlayer insulating layer 170 is formed on the entirety of the substrate shown in FIG. 31B, and patterning is performed as shown in FIG. 32A to form the openings 173 and 174. The opening 173 exposes a portion of the oxide semiconductor layer 140 that is located on the first insulating layer 133, and the openings 174 each expose a portion of the oxide semiconductor layer 140 that is located on the second insulating layer 134. Then, a film for the upper electrode 180 is formed on the entirety of the substrate shown in FIG. 32B, and patterning is performed to form the upper electrode 180 as shown in FIG. 28. In this manner, the semiconductor device 32 shown in FIG. 28 is manufactured.

The present invention is not limited to any of the above-described embodiments, and the embodiments may be modified appropriately without departing from the gist of the present invention.

What is claimed is:
1. A semiconductor device, comprising:
a first insulating layer having a first side wall;
an oxide semiconductor layer located on the first side wall;
a gate insulating layer located on the oxide semiconductor layer, the oxide semiconductor layer being located between the first side wall and the gate insulating layer;
a gate electrode facing the oxide semiconductor layer, the gate insulating layer being located between the oxide semiconductor layer and the gate electrode;
a first electrode connected with a first portion of the oxide semiconductor layer; and
a second electrode connected with a second portion of the oxide semiconductor layer;
wherein the oxide semiconductor layer is in contact with the first electrode via an opening in the first insulating layer.
2. The semiconductor device according to claim 1, further comprising a third electrode located, at a position above the first insulating layer, between the first insulating layer and the oxide semiconductor layer.
3. The semiconductor device according to claim 2, wherein the second electrode is connected with the third electrode.
4. The semiconductor device according to claim 3, further comprising an underlying layer located in contact with the first insulating layer and the first electrode at a position below the first insulating layer and the first electrode.
5. The semiconductor device according to claim 3, wherein the gate electrode is located in a ring shape around the first electrode.
6. The semiconductor device according to claim 2, further comprising an underlying layer located in contact with the first insulating layer and the first electrode at a position below the first insulating layer and the first electrode.
7. The semiconductor device according to claim 2, wherein the gate electrode is located in a ring shape around the first electrode.
8. The semiconductor device according to claim 1, further comprising an underlying layer located in contact with the first insulating layer and the first electrode at a position below the first insulating layer and the first electrode.
9. The semiconductor device according to claim 8, wherein the gate electrode is located in a ring shape around the first electrode.
10. The semiconductor device according to claim 1, wherein the gate electrode is located in a ring shape around the first electrode.
11. The semiconductor device according to claim 10, wherein:
a plurality of the semiconductor devices are located adjacent to each other; and
the first electrodes of the plurality of the semiconductor devices are provided as one integral first electrode, the second electrodes of the plurality of the semiconductor devices are provided as one integral second electrode, and the gate electrodes of the plurality of the semiconductor devices are provided as one integral gate electrode.
12. The semiconductor device according to claim 10, further comprising a ring-shaped second insulating layer located around the first insulating layer;
wherein:
the second insulating layer has a second side wall facing the first side wall of the first insulating layer; and
the gate electrode is located to face the first side wall and the second side wall.
13. The semiconductor device according to claim 1, wherein:
a plurality of the semiconductor devices are located adjacent to each other; and
the first electrodes of the plurality of the semiconductor devices are provided as one integral first electrode, the second electrodes of the plurality of the semiconductor devices are provided as one integral second electrode, and the gate electrodes of the plurality of the semiconductor devices are provided as one integral gate electrode.
14. The semiconductor device according to claim 1, further comprising a ring-shaped second insulating layer located around the first insulating layer;
wherein:
the second insulating layer has a second side wall facing the first side wall of the first insulating layer; and
the gate electrode is located to face the first side wall and the second side wall.

15. A semiconductor device, comprising:
a first insulating layer having a first side wall;
a first electrode;
an oxide semiconductor layer located on the first side wall, a first portion of the oxide semiconductor layer being connected with the first electrode;
a gate insulating layer located on the oxide semiconductor layer, the oxide semiconductor layer being located between the first side wall and the gate insulating layer;
a gate electrode facing the oxide semiconductor layer located on the first side wall, the gate insulating layer being located between the oxide semiconductor layer and the gate electrode;
a second electrode connected with a second portion of the oxide semiconductor layer; and
a third electrode located above the first electrode and connected with the first electrode;
wherein the oxide semiconductor layer is in contact with the second electrode via an opening in the first insulating layer.

16. The semiconductor device according to claim 15, further comprising an underlying layer located in contact with the first insulating layer and the second electrode at a position below the first insulating layer and the second electrode.

17. The semiconductor device according to claim 16, wherein the gate electrode is located in a ring shape around the second electrode.

18. The semiconductor device according to claim 15, wherein the gate electrode is located in a ring shape around the second electrode.

19. The semiconductor device according to claim 18, wherein:
a plurality of the semiconductor devices are located adjacent to each other; and
the second electrodes of the plurality of the semiconductor devices are provided as one integral second electrode, the third electrodes of the plurality of the semiconductor devices are provided as one integral third electrode, and the gate electrodes of the plurality of the semiconductor devices are provided as one integral gate electrode.

20. The semiconductor device according to claim 18, further comprising a ring-shaped second insulating layer located around the first insulating layer;
wherein:
the second insulating layer has a second side wall facing the first side wall of the first insulating layer; and
the gate electrode is located to face the first side wall and the second side wall.

* * * * *